(12) United States Patent
Suzuki et al.

(10) Patent No.: US 10,831,395 B2
(45) Date of Patent: Nov. 10, 2020

(54) MEMORY SYSTEM, CONTROL METHOD, AND CONTROL DEVICE

(71) Applicant: TOSHIBA MEMORY CORPORATION, Minato-ku (JP)

(72) Inventors: Riki Suzuki, Yokohama (JP); Yoshihisa Kojima, Kawasaki (JP); Toshikatsu Hida, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 56 days.

(21) Appl. No.: 16/212,730

(22) Filed: Dec. 7, 2018

(65) Prior Publication Data

US 2019/0294358 A1     Sep. 26, 2019

(30) Foreign Application Priority Data

Mar. 23, 2018 (JP) ................. 2018-056374

(51) Int. Cl.
*G06F 3/06* (2006.01)
*G11C 29/52* (2006.01)
*G06F 11/10* (2006.01)

(52) U.S. Cl.
CPC ............ *G06F 3/0647* (2013.01); *G06F 3/064* (2013.01); *G06F 3/0611* (2013.01); *G06F 3/0619* (2013.01); *G06F 3/0679* (2013.01); *G06F 11/1068* (2013.01); *G11C 29/52* (2013.01)

(58) Field of Classification Search
CPC ...... G06F 3/0679; G06F 3/0619; G06F 3/064; G06F 3/0647; G06F 11/1068; G06F 11/1048; G06F 3/0611; G11C 29/52; G11C 2029/0409; G11C 7/02

USPC ......................................................... 711/103
See application file for complete search history.

(56) References Cited

U.S. PATENT DOCUMENTS

| | | | |
|---|---|---|---|
| 8,281,220 B2 | 10/2012 | Kitahara | |
| 8,929,140 B2 | 1/2015 | Nagashima | |
| 9,129,699 B2 | 9/2015 | Suzuki et al. | |
| 9,141,534 B2 | 9/2015 | D'Abreu et al. | |
| 2009/0172267 A1 | 7/2009 | Oribe et al. | |
| 2014/0173180 A1 | 6/2014 | D'Abreu et al. | |
| 2016/0155516 A1* | 6/2016 | Chang | G06F 12/023 |
| 2016/0172045 A1* | 6/2016 | Shukla | G11C 16/0483 365/185.12 |
| 2017/0132125 A1* | 5/2017 | Cai | G06F 11/1072 |
| 2018/0033491 A1* | 2/2018 | Marelli | G06F 11/076 |

(Continued)

FOREIGN PATENT DOCUMENTS

| | | |
|---|---|---|
| JP | 2008-287404 | 11/2008 |
| JP | 2009-223876 | 10/2009 |
| JP | 4377950 | 12/2009 |

(Continued)

*Primary Examiner* — Hashem Farrokh
(74) *Attorney, Agent, or Firm* — Oblon, McClelland, Maier & Neustadt, L.L.P.

(57) ABSTRACT

According to one embodiment, a memory system includes a memory and a controller electrically connected to the memory. The memory includes blocks. Each of the blocks includes one or more sub-blocks. Each of the one or more sub-blocks includes nonvolatile memory cells. The controller is configured to obtain read frequency of at least one of the sub-blocks, and move data stored in the at least one of the sub-blocks so that data having substantially the same read frequency are written into one block.

18 Claims, 28 Drawing Sheets

(56) References Cited

U.S. PATENT DOCUMENTS

2018/0067697 A1* 3/2018 Lee .................... G11C 11/5628
2018/0190362 A1* 7/2018 Barndt ............... G11C 16/3431

FOREIGN PATENT DOCUMENTS

| JP | 2011-100519 | 5/2011 |
| JP | 5349256 | 11/2013 |
| JP | 2014-505941 | 3/2014 |
| JP | 5629391 | 11/2014 |

* cited by examiner

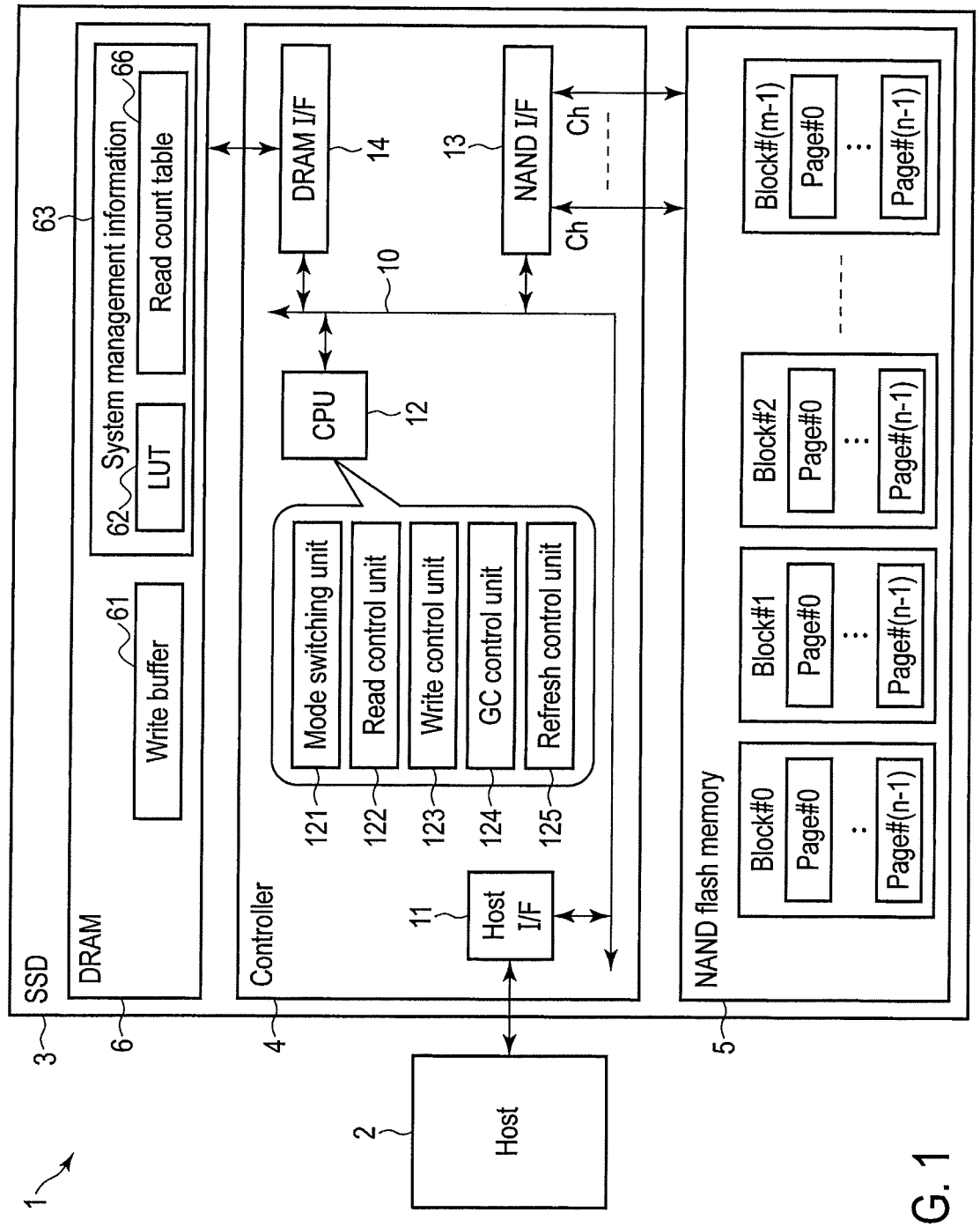
F I G. 1

Read count table
| Block | Read count |
|---|---|
| Block#0 | 0.5k |
| Block#1 | 100k |
| ⋮ | ⋮ |
| Block#(m-1) | 10k |
~66
F I G. 2A
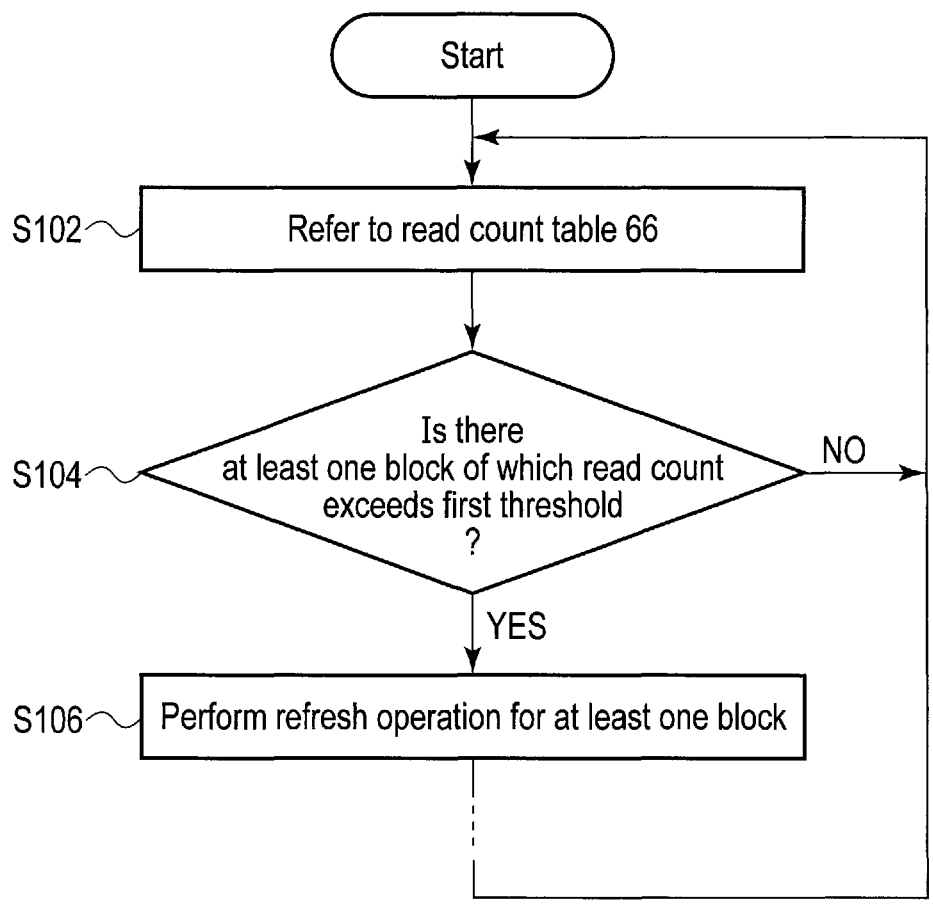
F I G. 2B

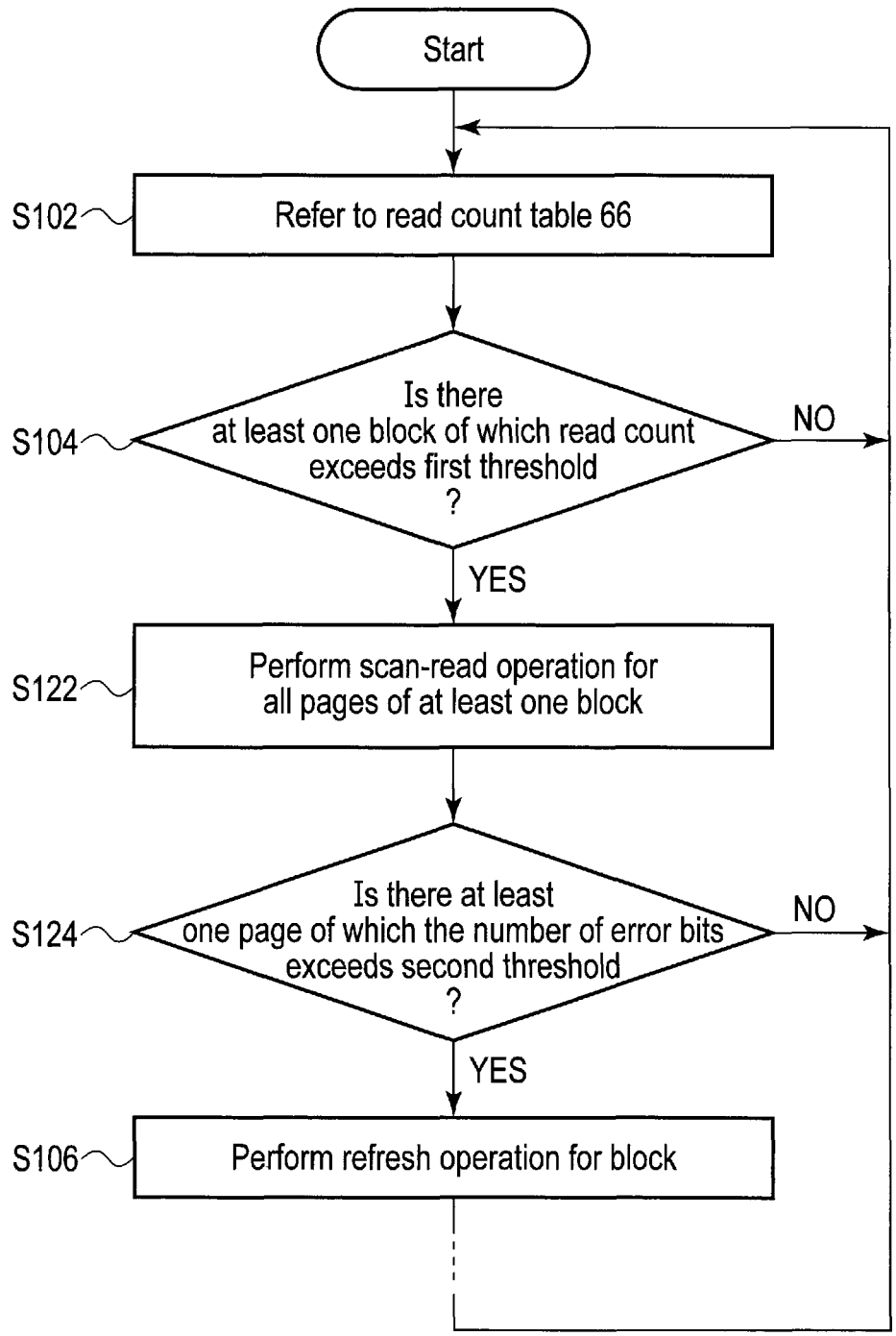
F I G. 3

FIG. 4A

| | Block#0 | | Block#1 | | Block#2 | | Block#3 | | Block#4 |
|---|---|---|---|---|---|---|---|---|---|
| Page#0 | 0k | Page#0 | 100k | Page#0 | 0k | Page#0 | 100k | Page#0 | 0k |
| Page#1 | 100k | Page#1 | 0k | Page#1 | 0k | Page#1 | 0k | Page#1 | 0k |
| Page#2 | 0k | Page#2 | 0k | Page#2 | 0k | Page#2 | 0k | Page#2 | 0k |
| Page#3 | 0k | Page#3 | 0k | Page#3 | 100k | Page#3 | 0k | Page#3 | 0k |
| Page#4 | 0k | Page#4 | 0k | Page#4 | 0k | Page#4 | 0k | Page#4 | 100k |

FIG. 4B

| | Block#0 | | Block#1 | | Block#2 | | Block#3 | | Block#4 |
|---|---|---|---|---|---|---|---|---|---|
| Page#0 | 0k | Page#0 | 0k | Page#0 | 100k | Page#0 | 0k | Page#0 | 0k |
| Page#1 | 0k | Page#1 | 0k | Page#1 | 100k | Page#1 | 0k | Page#1 | 0k |
| Page#2 | 0k | Page#2 | 0k | Page#2 | 100k | Page#2 | 0k | Page#2 | 0k |
| Page#3 | 0k | Page#3 | 0k | Page#3 | 100k | Page#3 | 0k | Page#3 | 0k |
| Page#4 | 0k | Page#4 | 0k | Page#4 | 100k | Page#4 | 0k | Page#4 | 0k |

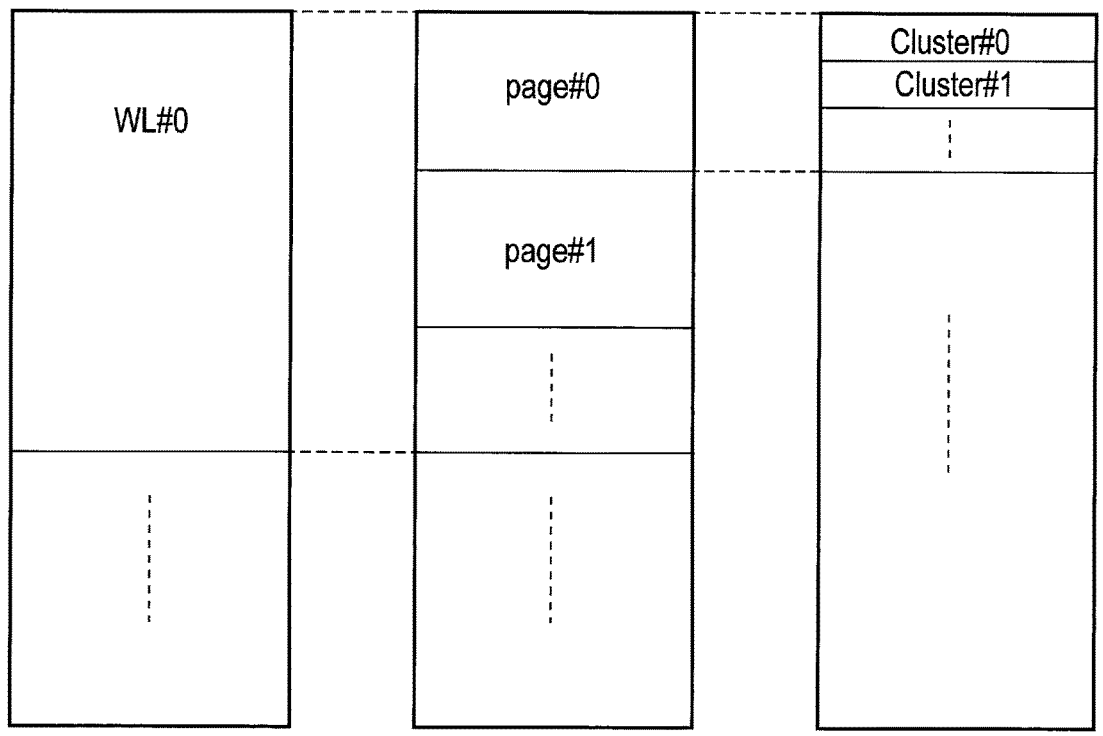
F I G. 5
F I G. 7

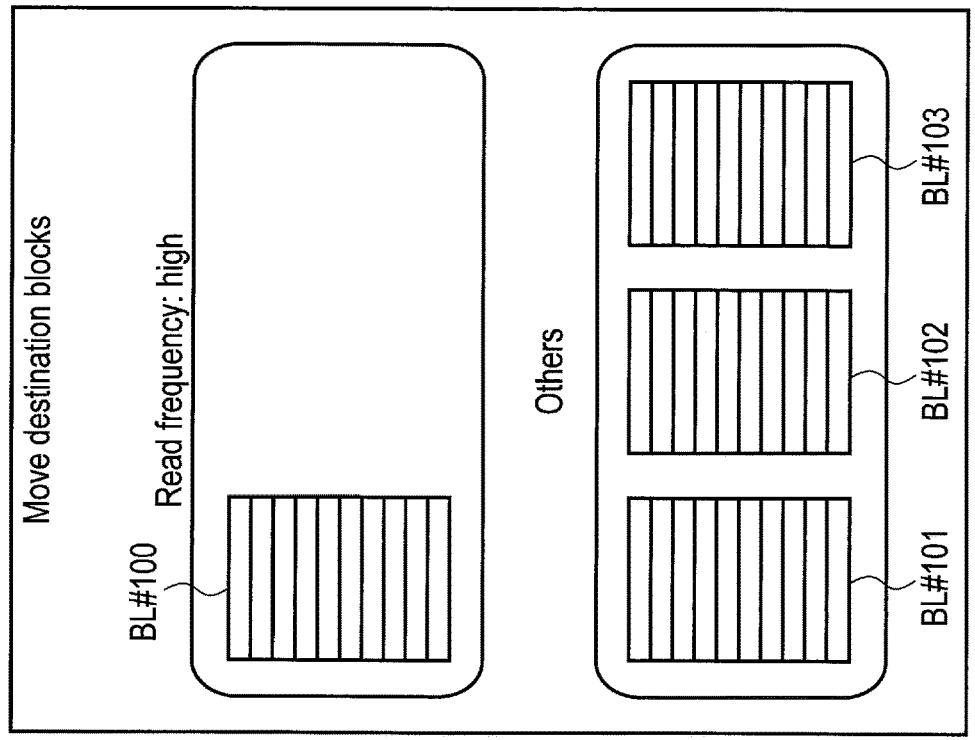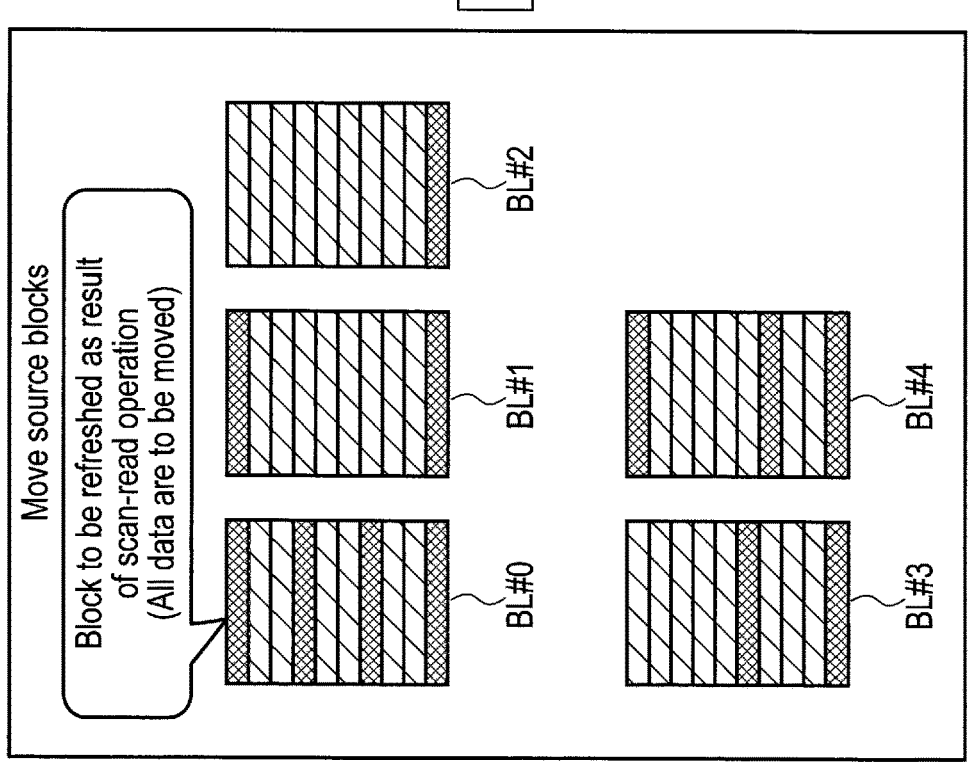
FIG. 14

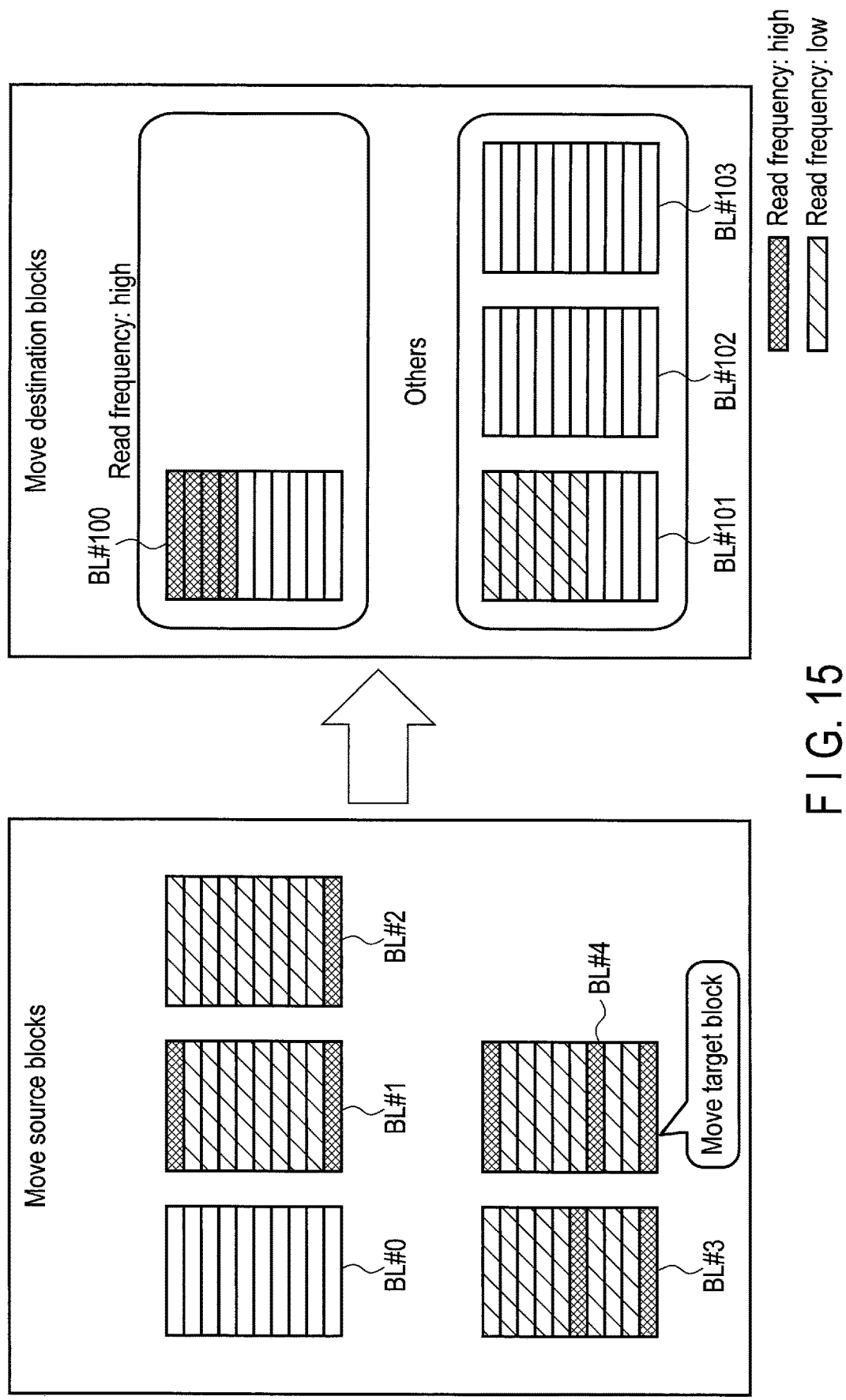
F I G. 15

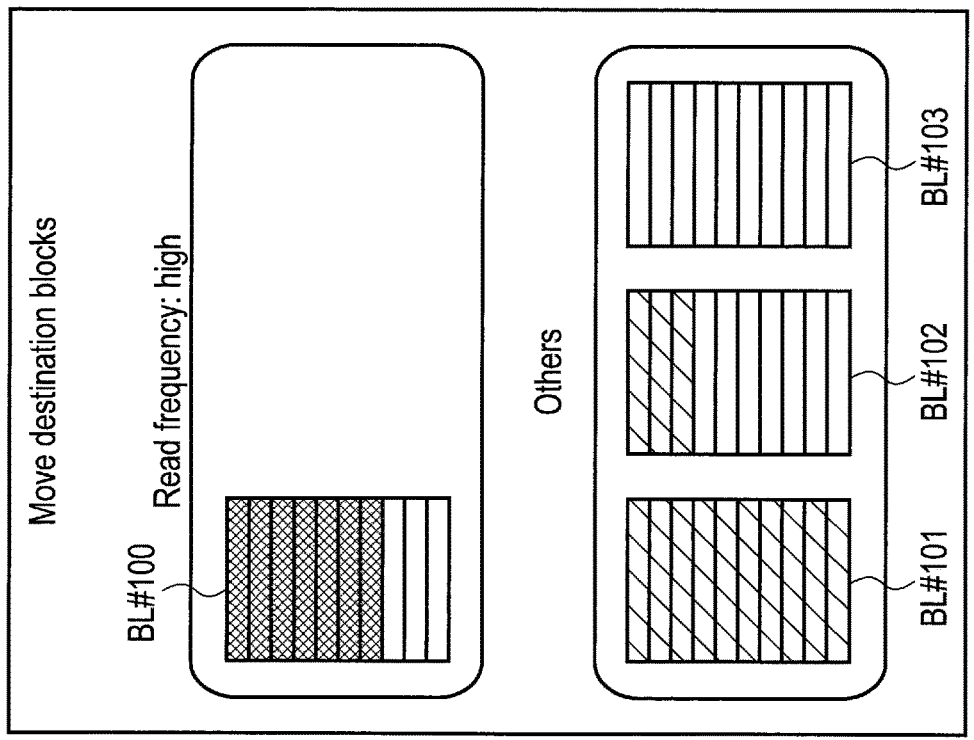
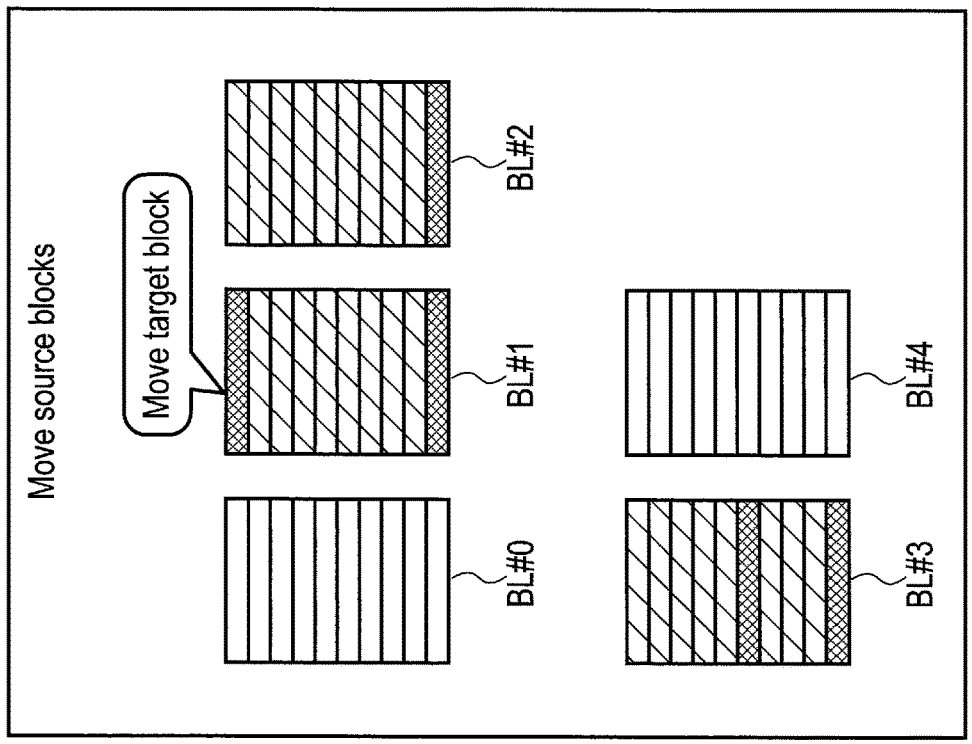
FIG. 16

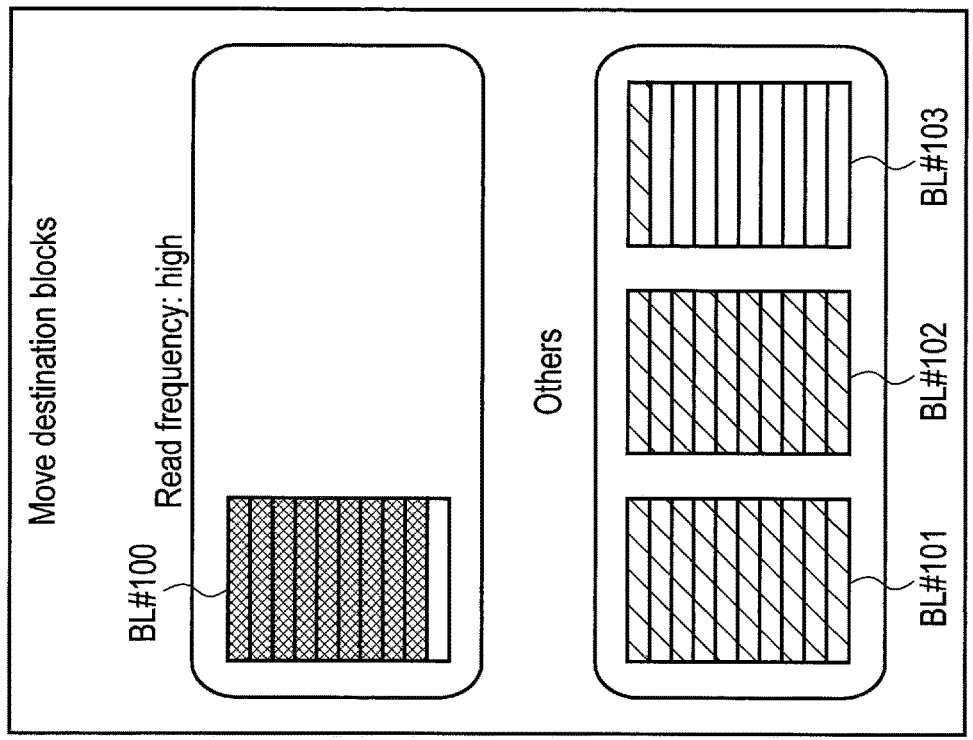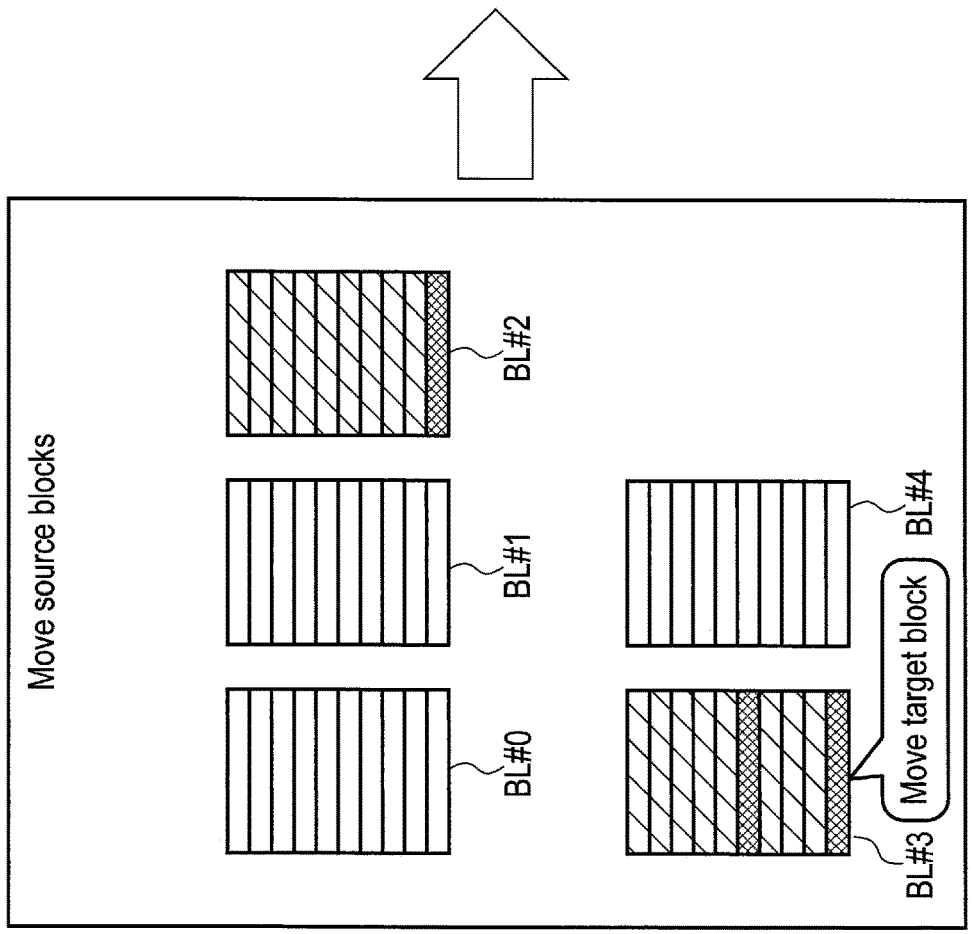
FIG. 17

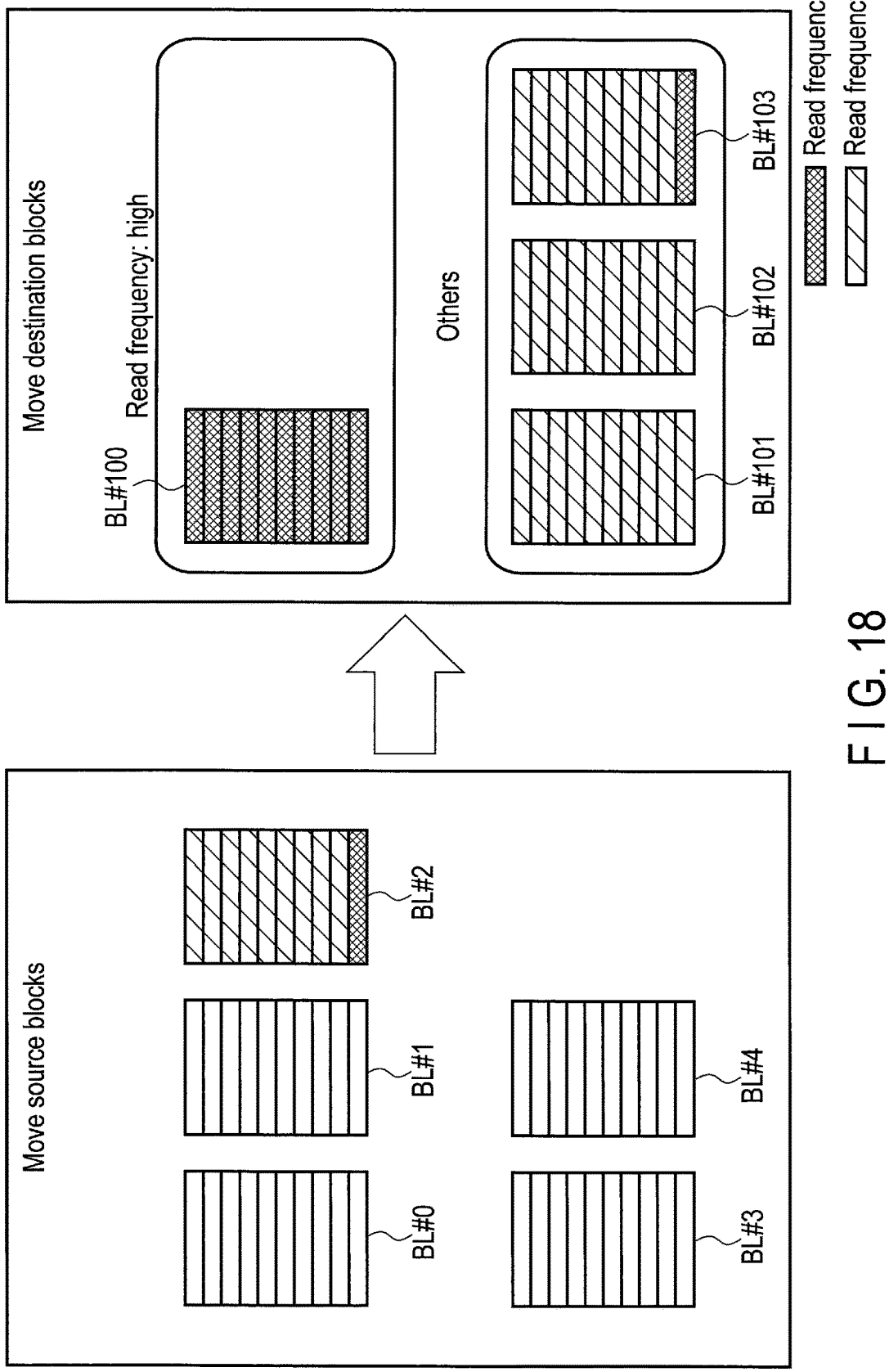
F I G. 18

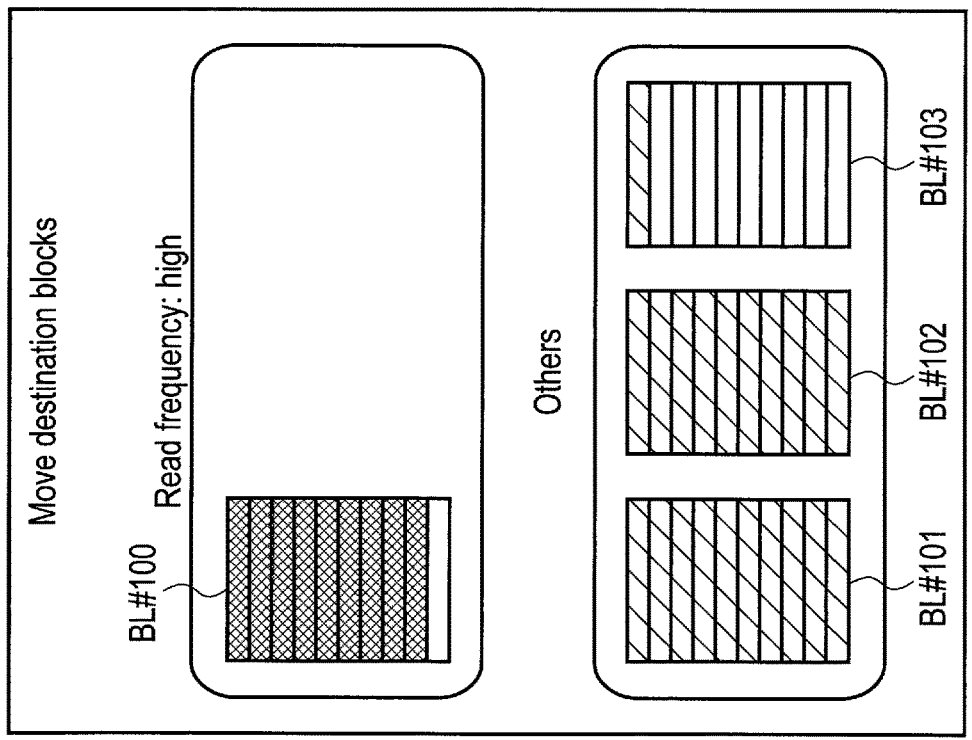
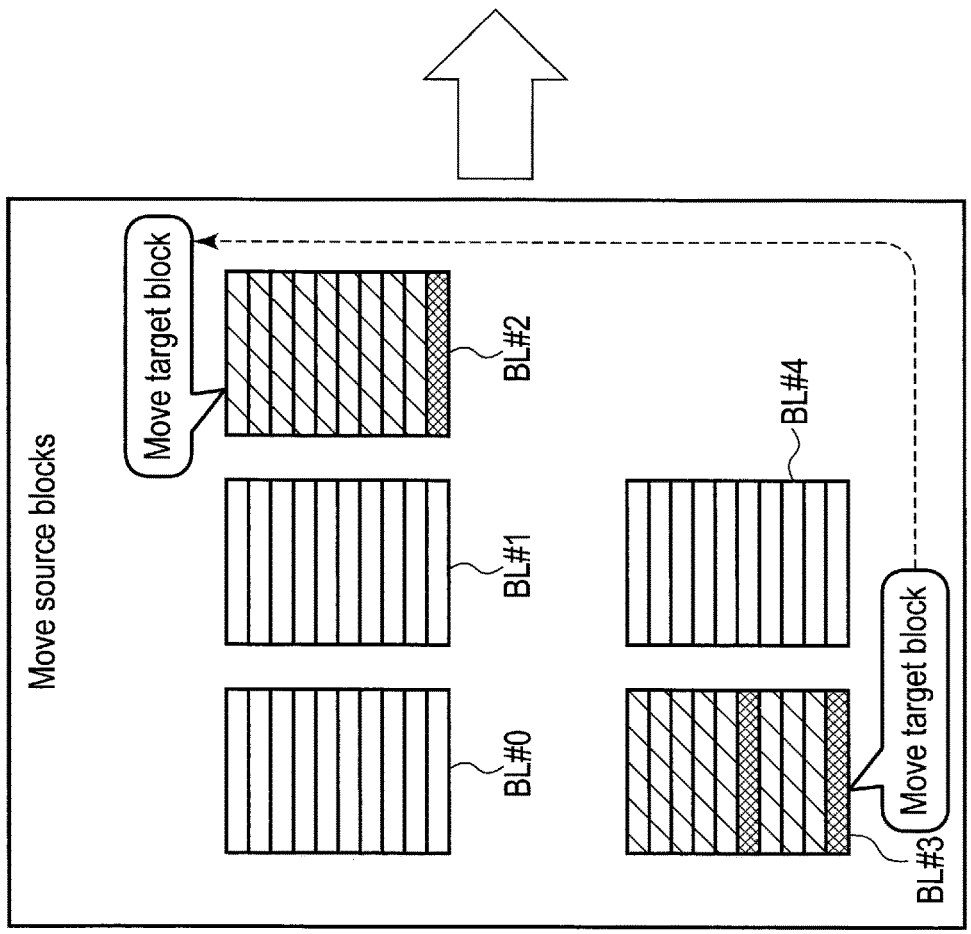
FIG. 19

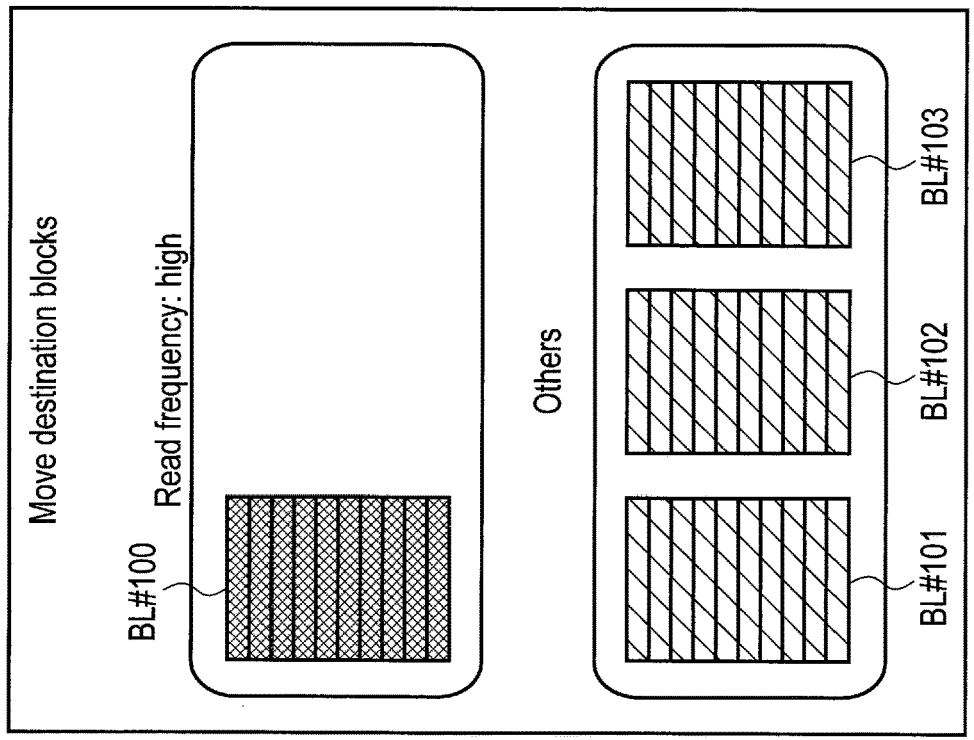
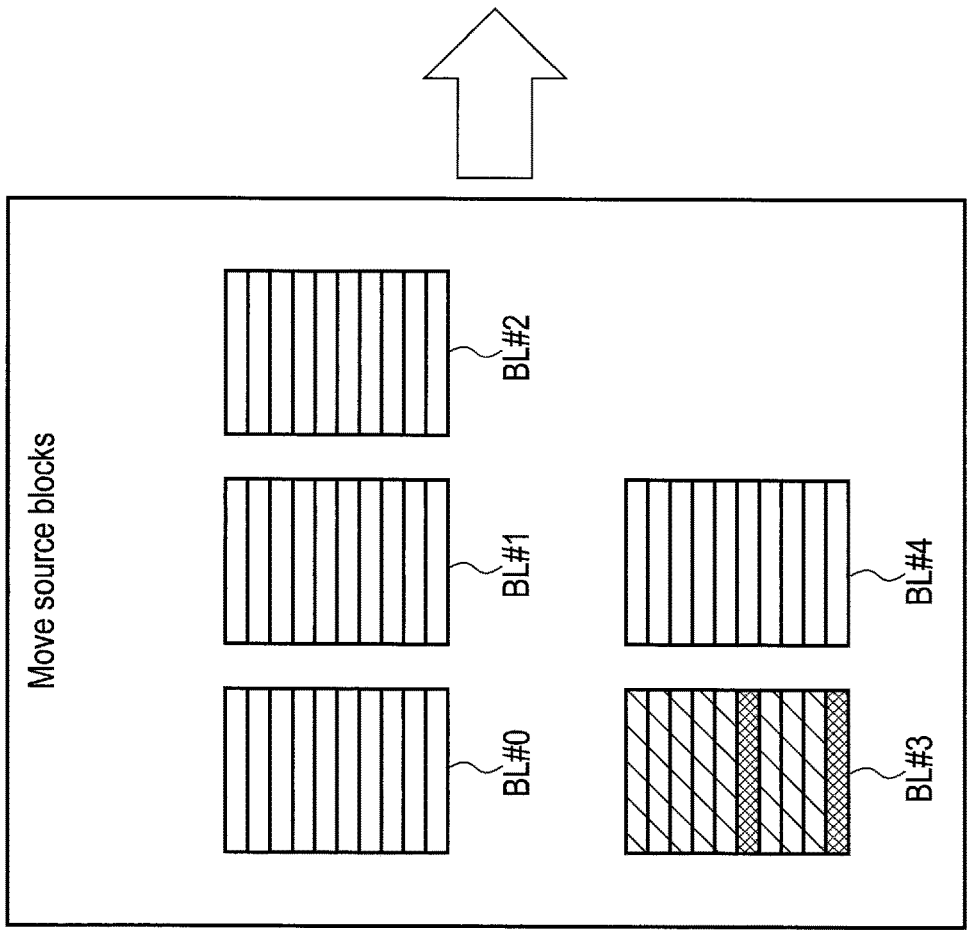
F I G. 20

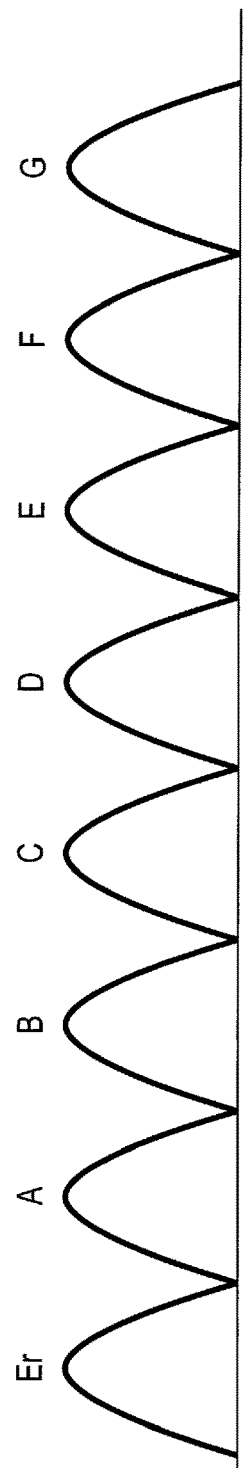
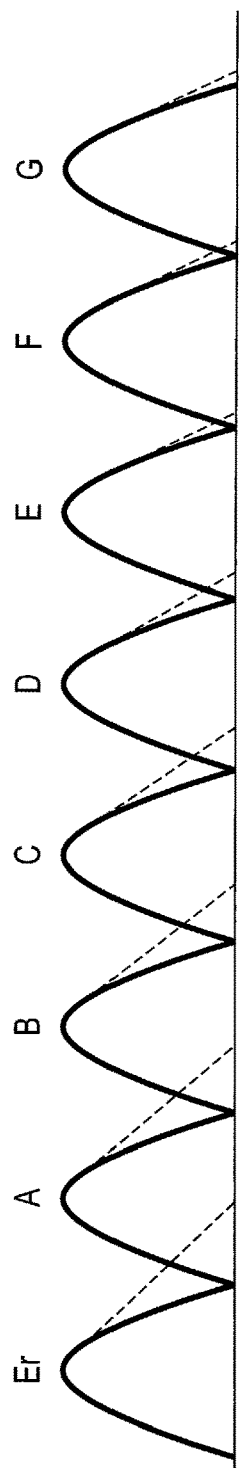
F I G. 21A
F I G. 21B

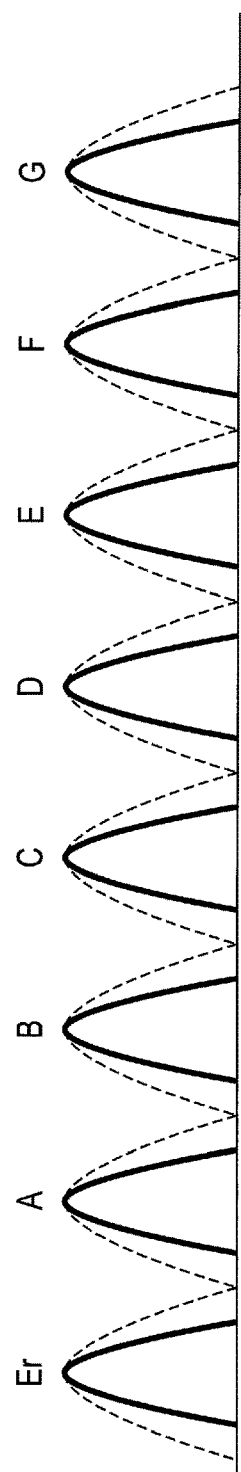
F I G. 22A
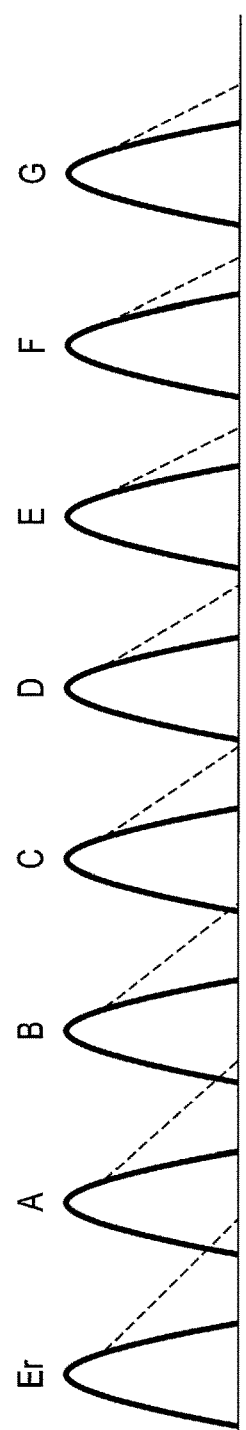
F I G. 22B

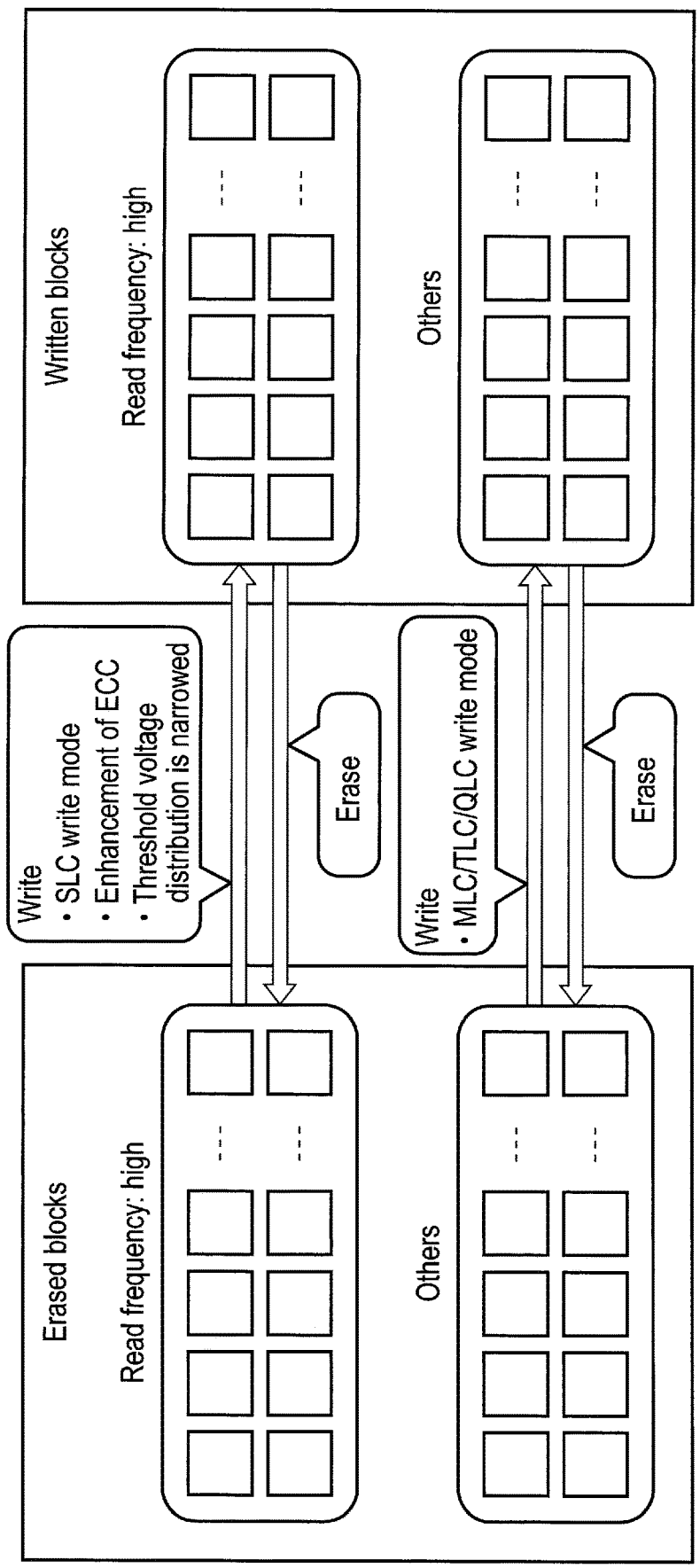
F I G. 25

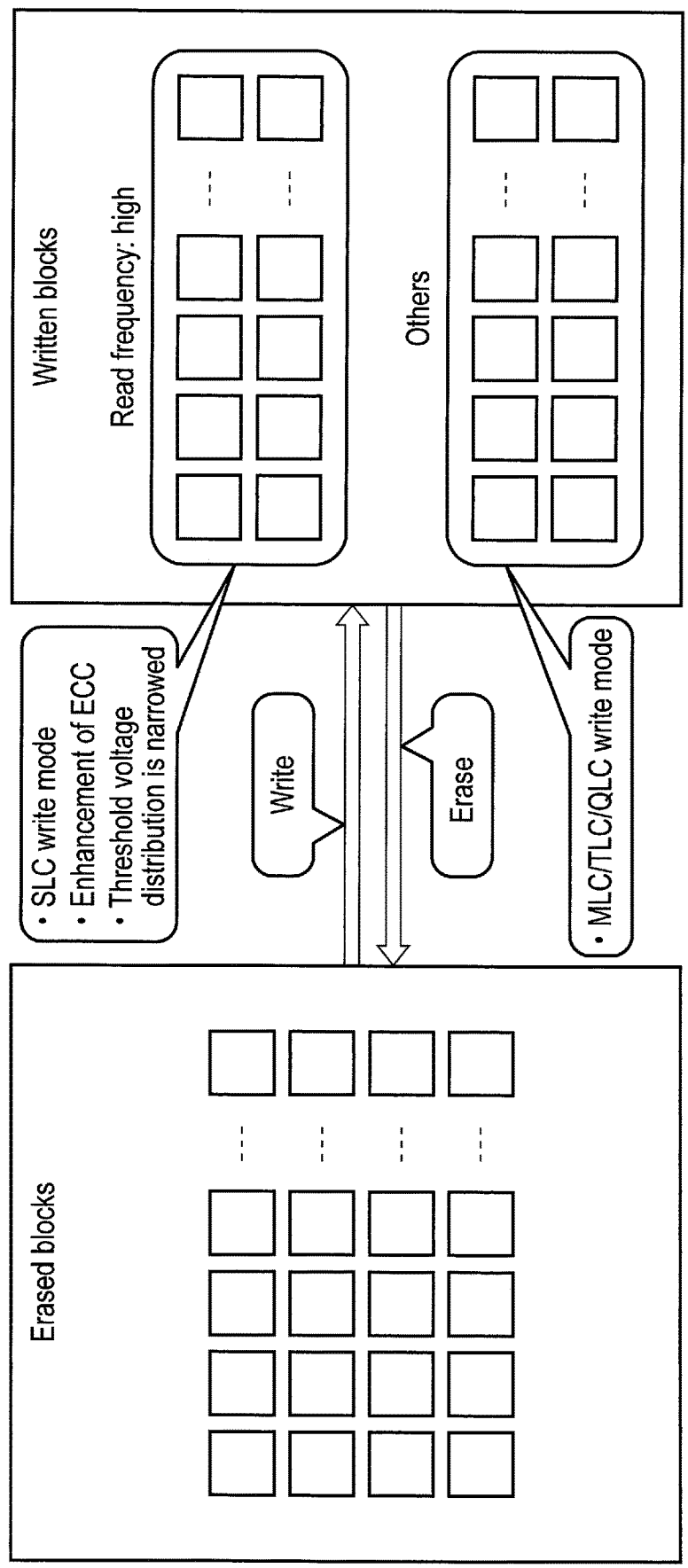
F I G. 26

FIG. 27A

| | Block#0 | | Block#1 | | Block#2 | | Block#3 | | Block#4 |
|---|---|---|---|---|---|---|---|---|---|
| Page#0 | 0.5k | Page#0 | 80k | Page#0 | 0.5k | Page#0 | 74k | Page#0 | 10k |
| Page#1 | 98k | Page#1 | 5k | Page#1 | 10k | Page#1 | 1k | Page#1 | 10k |
| Page#2 | 0.5k | Page#2 | 5k | Page#2 | 5k | Page#2 | 1k | Page#2 | 10k |
| Page#3 | 0.5k | Page#3 | 5k | Page#3 | 83.5k | Page#3 | 1k | Page#3 | 10k |
| Page#4 | 0.5k | Page#4 | 5k | Page#4 | 1k | Page#4 | 1k | Page#4 | 60k |

FIG. 27B

| | Block#0 | | Block#1 | | Block#2 | | Block#3 | | Block#4 |
|---|---|---|---|---|---|---|---|---|---|
| Page#0 | 0.5k | Page#0 | 5k | Page#0 | 98k | Page#0 | 1k | Page#0 | 10k |
| Page#1 | 0.5k | Page#1 | 5k | Page#1 | 80k | Page#1 | 1k | Page#1 | 10k |
| Page#2 | 0.5k | Page#2 | 5k | Page#2 | 74k | Page#2 | 1k | Page#2 | 10k |
| Page#3 | 0.5k | Page#3 | 5k | Page#3 | 83.5k | Page#3 | 1k | Page#3 | 10k |
| Page#4 | 0.5k | Page#4 | 5k | Page#4 | 60k | Page#4 | 1k | Page#4 | 10k |

MEMORY SYSTEM, CONTROL METHOD, AND CONTROL DEVICE

CROSS-REFERENCE TO RELATED APPLICATIONS

This application is based upon and claims the benefit of priority from Japanese Patent Application No. 2018-056374, filed Mar. 23, 2018, the entire contents of which are incorporated herein by reference.

FIELD

Embodiments described herein relate generally to a memory system, a control method, and a controller.

BACKGROUND

A memory system using a nonvolatile semiconductor memory, called a solid state drive (SSD), has been developed.

In the memory system using the nonvolatile semiconductor memory, miniaturization of a size of a memory cell is desired, but reliability of data stored in the memory cell might be deteriorated due to miniaturization.

BRIEF DESCRIPTION OF THE DRAWINGS

FIG. 1 is a block diagram of an example of a memory system according to a first embodiment.

FIGS. 2A and 2B are diagrams for describing an example of a first countermeasure against read disturb stress.

FIG. 3 is a diagram for describing an example of a second countermeasure against read disturb stress.

FIGS. 4A and 4B are diagrams for describing an example of a third countermeasure against read disturb stress.

FIG. 5 is a diagram for describing an example of a configuration of a block.

FIG. 7 is a diagram for describing an example of a read count table in the third countermeasure.

FIG. 14 is a diagram illustrating an example of a read frequency for each page.

FIG. 15 is a diagram illustrating another example of a read frequency for each page.

FIG. 16 is a diagram illustrating a still another example of a read frequency for each page.

FIG. 17 is a diagram illustrating a still another example of a read frequency for each page.

FIG. 18 is a diagram illustrating a still another example of a read frequency for each page.

FIG. 19 is a diagram for describing another example of data movement in the third countermeasure.

FIG. 20 is a diagram for describing another example of data movement in the third countermeasure.

FIGS. 21A and 21B are diagrams illustrating an example of threshold voltage distributions of memory cell transistors in a TLC flash memory in a comparative example.

FIGS. 22A and 22B are diagrams illustrating an example of threshold voltage distributions of memory cell transistors in a method of writing data with high reliability in a fourth countermeasure against read disturb stress.

FIG. 25 is a diagram illustrating an example of selecting a writing method in the fourth countermeasure.

FIG. 26 is a diagram illustrating another example of selecting a writing method in the fourth countermeasure.

FIGS. 27A and 27B are diagrams illustrating an example of a fifth countermeasure against read disturb stress.

DETAILED DESCRIPTION

Figure 6:
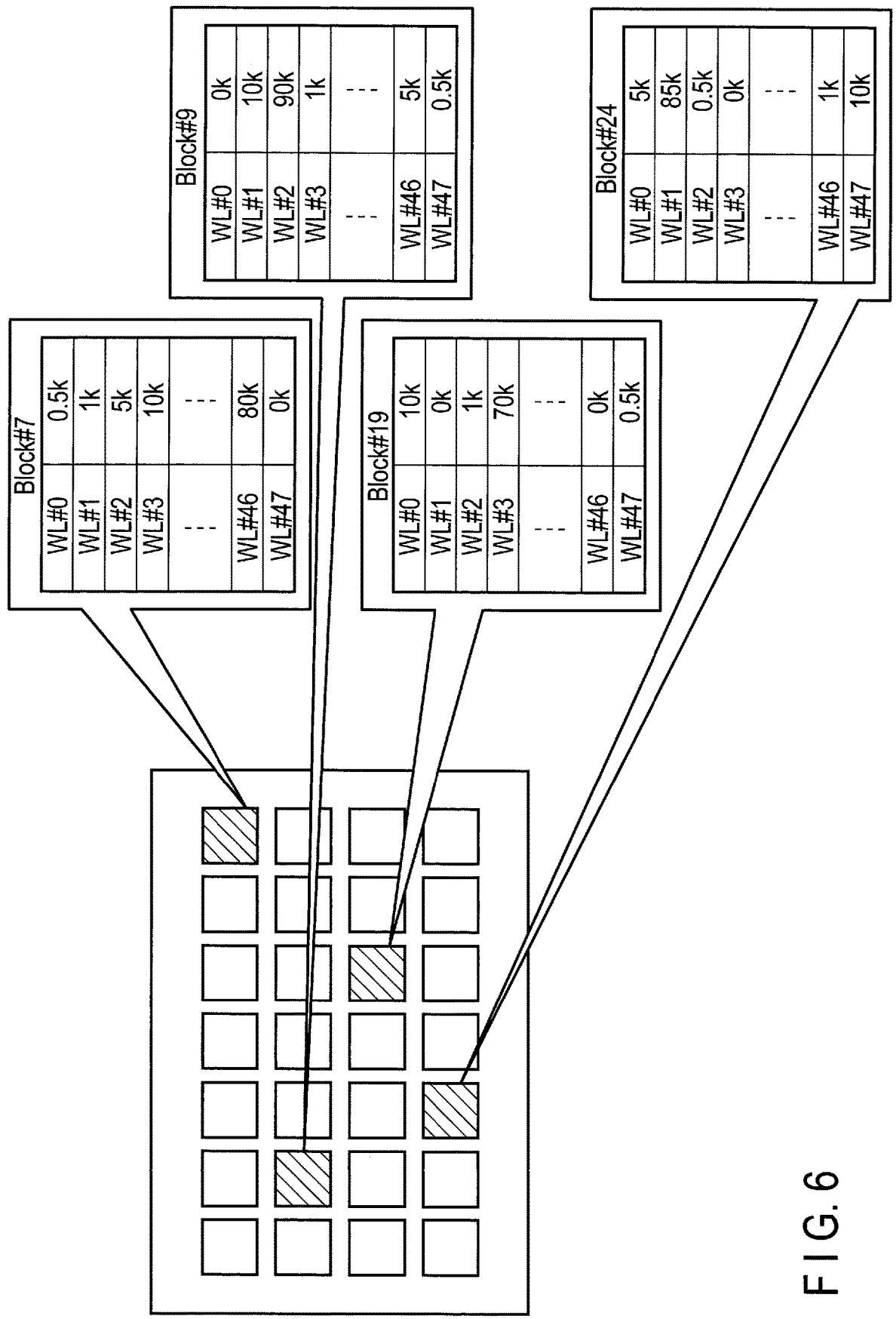
FIG. 6 is a diagram for describing an example of data movement relating to a word line in the third countermeasure.

Various embodiments will be described hereinafter with reference to the accompanying drawings. The disclosure is merely an example and is not limited by contents described in the embodiments described below. Modification which is easily conceivable by a person of ordinary skill in the art comes within the scope of the disclosure as a matter of course. In order to make the description clearer, the sizes, shapes and the like of the respective parts may be changed and illustrated schematically in the drawings as compared with those in an accurate representation. Constituent elements corresponding to each other in a plurality of drawings are denoted by similar reference numerals and their detailed descriptions may be omitted unless necessary.

In general, according to one embodiment, a memory system includes a memory and a controller electrically connected to the memory. The memory includes blocks. Each of the blocks includes one or more sub-blocks. Each of the one or more sub-blocks includes nonvolatile memory cells. The controller is configured to obtain read frequency of at least one of the sub-blocks, and move data stored in the at least one of the sub-blocks so that data having substantially the same read frequency are written into one block.

First Embodiment

A memory system according to a first embodiment will be described. In the first embodiment, a NAND-type flash memory (hereinafter referred to as a NAND flash memory) is used as a nonvolatile semiconductor memory, but other nonvolatile semiconductor memories may also be used.

A configuration of an information processing system 1 that includes a memory system according to the first embodiment will be described with reference to FIG. 1.

The information processing system 1 includes a host device (hereinafter referred to as a host) 2 and a memory system 3. The memory system 3 is a semiconductor storage device that writes data into a nonvolatile memory and reads data from the nonvolatile memory. The memory system 3 may be an SSD that includes a nonvolatile semiconductor memory, for example, a NAND flash memory. Hereinafter, the memory system 3 is referred to as an SSD 3.

The host 2 is an information processing device (also referred to as a computing device) that accesses the SSD 3. The host 2 may be a server (also referred to as a storage server) that stores a large amount of various data in the SSD 3, or may be a personal computer.

The SSD 3 can be used as a main storage of the information processing device that functions as the host 2. The SSD 3 may be integrated with the information processing device, or may be connected to the information processing device via a cable or a network.

As an interface configured to electrically interconnect the host 2 and the SSD 3, SCSI (registered trademark), Serial Attached SCSI (SAS) (registered trademark), ATA (registered trademark), Serial ATA (SATA) (registered trademark), PCI Express (PCIe) (registered trademark), Ethernet, (registered trademark), Fibre channel (registered trademark), NVM Express (NVMe) (registered trademark), or the like may be used.

The SSD 3 includes a controller 4 and a NAND flash memory 5. The controller 4 can be realized as a circuit such as system-on-a-chip (SoC). The SSD 3 may include a random access memory which is a volatile memory, for example, a DRAM 6. The DRAM 6 may be provided outside the controller 4. Alternatively, the random access memory such as an SRAM may be provided in the controller 4.

The random access memory such as the DRAM 6 may include a write buffer 61 which is a buffer area that temporarily stores data to be written into the NAND flash memory 5, and a storage area of system management information 63. The storage area of system management information 63 includes a cache area of a look-up table (referred to as an LUT) 62 that functions as an address translation table (also referred to as a logical/physical address translation table), and a storage area of various values or various tables, for example, a read count table 66 or the like, used during the operation of the SSD 3.

The LUT 62 manages mapping between a logical address of the memory system and a physical address of the NAND flash memory 5.

The read count table 66 stores a read count of the memory cells in a block or a unit of memory cells smaller than the block, for example, the memory cells in a page. The read count returns to zero when data is erased from the block. Since the read count is equivalent to a read frequency, the read frequency may be used instead of the read count.

The NAND flash memory 5 may include a plurality of NAND flash, memory chips, that is, a plurality of NAND flash memory dies. Each chip is realized as a flash memory that can store one bit or a plurality of bits per memory cell.

Examples of the flash memory that can store a plurality of bits per memory cell include a multi-level cell MLC (i.e., four-level cell referred to as 4LC) flash memory that can store 2-bit data per memory cell, a triple-level cell TLC (i.e., eight-level cell referred to as 8LC) flash memory that can store 3-bit data per memory cell, a quad-level cell QLC (i.e., sixteen-level cell referred to as 16LC) flash memory that can store 4-bit data per memory cell, and the like. The flash memory that stores 1 bit per memory cell is referred to as a single-level cell SLC (i.e., two-level cell referred to as 2LC) flash memory.

The NAND flash memory 5 includes a memory cell array that includes a plurality of memory cells arranged in a matrix form. The NAND flash memory 5 may have a two-dimensional structure or a three-dimensional structure.

The memory cell array of the NAND flash memory 5 includes a plurality of blocks (also referred to as BLs) #0 to # (m−1). Each of the blocks #0 to # (m−1) includes a plurality of pages, here, pages #0 to # (n−1). Each of the blocks #0 to # (m−1) functions as a minimum erase unit. The block may also be referred to as an "erase block" or a "physical block". Each of the pages #0 to # (n−1) includes a plurality of memory cells connected to the same word line. The pages #0 to # (n−1) are units of data write operation and data read operation. Instead of the page, the word line may be used as unit of the data write operation and the data read operation.

The maximum number of allowable program/erase cycles (referred to as P/E cycles) for each of the blocks #0 to # (m−1) is limited. One PIE cycle of a certain block includes an erase operation that sets all the memory cells in the block to an erased-state and a write operation (also referred to as a program operation) that writes data into each page in the block.

The NAND flash memory 5 can perform a write operation in one of an SLC mode in which 1-bit data is stored per memory cell, an MLC mode in which 2-bit data is stored per memory cell, a TLC mode in which 3-bit data is stored per memory cell, and a QLC mode in which 4-bit data is stored per memory cell.

For example, the plurality of blocks included in the NAND flash memory 5 may be configured as a block belonging to one of an SLC dedicated block group and a TLC/QLC common block group. Data is written into a block belonging to the SLC dedicated block group only in the SLC mode. Data is written into a block belonging to the TLC/QLC common block group in the TLC mode or the QLC mode. For each of the plurality of blocks, the mode in which a write operation is performed is not fixed but may be dynamically changed. For example, data may be written in the SLC mode at one time, and may be written in another mode, for example, the MLC mode at another time. The change in the write mode is not limited to between the SLC mode and the MLC mode, but changes among all of the SLC mode, the MLC mode, the TLC mode, and the QLC mode can be included.

The NAND flash memory 5 may be realized as an MLC flash memory (i.e., a 4LC flash memory) that can store 2-bit data per memory cell.

In this case, data of two pages (lower page data and upper page data) are written into the plurality of memory cells connected to the same word line. Thus, 2-bit data can be written per memory cell. Any area, for example, any one or more blocks, in an MLC flash memory may be used as an area that can store only 1-bit data per memory cell, that is, an SLC area.

In a write operation of writing data in the SLC area, only data of one page (lower page data) is written into the plurality of memory cells connected to the same word line. Thus, in each block used as the SLC area, only 1-bit data can be written per memory cell, like each SLC block in an SLC flash memory. As a result, each block used as the SLC area functions as a pseudo SLC block.

Alternatively, the NAND flash memory 5 may be a TLC flash memory (i.e., an 8LC flash memory) that can store 3-bit data per memory cell.

In this case, data of three pages (lower page data, middle page data, and upper page data) are written into the plurality of memory cells connected to the same word line. Thus, 3-bit data can be written per memory cell. Any area, for example, any one or more blocks, in a TLC flash memory may be used as the above-mentioned SLC area, or may be used as an MLC area that can store 2-bit data per memory cell. In the MLC area, only data of two pages are written into the plurality of memory cells connected to the same word line. Therefore, in the MLC area, only 2-bit data can be written per memory cell. The SLC/MLC area may be set in association with a unit smaller than the block (for example, a unit of a word line, or a unit of a set of a plurality of word lines in the block).

Alternatively, the NAND flash memory 5 may be a QLC flash memory (i.e., a 16LC flash memory) that can store 4-bit data per memory cell.

In this case, data of four pages are written into the plurality of memory cells connected to the same word line. Therefore, 4-bit data can be written per memory cell. Any area, for example, any one or more blocks, in a QLC flash memory may be used as the above-mentioned SLC area, may be used as the above-mentioned MLC area, or may be used as a TLC area that can store 3-bit data per memory cell. In the TLC area, only data of three pages are written into the plurality of memory cells connected to the same word line. Thus, in the TLC area, 3-bit data can be written per memory cell. The SLC/MLC/TLC area may be set in association with a unit smaller than the block (for example, a unit of a word line, or a unit of a set of a plurality of word lines in the block).

Data density per memory cell (here, the number of bits per memory cell) in each write mode may be 2 bits in the SLC mode, 4 bits in the MLC mode, 8 bits in the TLC mode, and 16 bits in the QLC mode. When assuming that data of one page is stored in the memory cells connected to the same word line in the SLC mode, data of two pages is to be stored in the MLC mode, data of three pages is to be stored in the TLC mode, and data of four pages is to be stored in the QLC mode. Data read speed and data write speed with respect to the NAND flash memory 5 are slow as the data density is high, and are faster as the data density is low. Therefore, in these four modes, reading and writing of data are the slowest in the QLC mode, and the fastest in the SLC mode.

When assuming that the NAND flash memory 5 is always used at the same data density, the lifetime (for example, the guaranteed number of P/E cycles) of the NAND flash memory 5 is shorter as the data density is high, and is longer as data density is low. The allowable number of P/E cycles is the largest in the SLC mode and decreases toward the MLC mode, the TLC mode, and the QLC mode. In other words, as the data density is low, a margin between the threshold voltage distributions corresponding to the adjacent states is wider, and as the data density is high, the margin between the threshold voltage distributions is narrower. When the margin is wide, even if the threshold voltage of the memory cell is varied due to stresses exerted to the memory cell, it is possible to suppress an increase in the probability that data of the memory cell will be read as erroneous data.

The NAND flash memory 5 may store 5-bit data or more per memory cell. If the NAND flash memory 5 can store 5-bit data per memory cell, any area in the NAND flash memory 5 can be used as an area into which only data of 4 bits or less is written per memory cell.

An example of the storage capacity of the SSD 3 according to each write mode will be described. It is assumed that the plurality of NAND flash memory chips included in the NAND flash memory 5 are QLC flash memories that can store 4-bit data per memory cell. When data is written into the NAND flash memory 5 in the QLC mode, the storage capacity of the SSD 3 is, for example, 512 GB. Under optimal conditions in which defective (bad) blocks do not exist, for example, the storage capacity of the SSD 3 when data is written into the NAND flash memory 5 in the TLC mode is 384 GB, the storage capacity of the SSD 3 when data is written in the MLC mode is 256 GB, and the storage capacity of the SSD 3 when data is written in the SLC mode is 128 GB. As described above, the storage capacity of the NAND flash memory 5 and the storage capacity of the SSD 3 are different according to the write modes.

The controller 4 is electrically connected to the NAND flash memory 5 through a NAND interface 13 such as Toggle DDR or Open NAND Flash Interface (ONFI). The NAND interface 13 functions as a NAND control circuit that controls the NAND flash memory 5. The NAND interface 13 may be electrically connected to the plurality of chips in the NAND flash memory 5 through a plurality of channels, respectively.

The controller 4 functions as a memory controller that controls the NAND flash memory 5.

The controller 4 may function as a flash translation layer (FTL) that performs data management and block management of the NAND flash memory 5. The data management performed by the FTL may include (1) management of mapping information indicative of the correspondence between a logical address of the memory system and a physical address of the NAND flash memory 5, (2) a process of concealing the read/write operations in units of word lines and the erase operation in units of blocks, and the like. The logical address is an address used by the host 2 so as to address the SSD 3. As the logical address, a logical block address (LBA) may be used.

The management of the mapping between the logical address and the physical address may be performed by using a look-up table 62 that functions as an address translation table. The controller 4 uses the look-up table 62 to manage the mapping between the logical address and the physical address in units of a predetermined management size. The physical address corresponding to a certain logical address indicates a physical storage location in the NAND flash memory 5 into which data designated by the logical address is written. The look-up table 62 may be loaded from the NAND flash memory 5 into the DRAM 6 when the power of the SSD 3 is turned on.

Data can be written into one word line only once per P/E cycle. Accordingly, when updating previous data stored in a physical storage location corresponding to a certain logical address, the controller 4 writes update data corresponding to the certain logical address to another physical storage location, not to the physical storage location in which the previous data is stored. The controller 4 then updates the look-up table 62 so as to associate the certain logical address with said another physical storage location and invalidates the previous data. Hereinafter, data referred to from the look-up table 62 (that is, data associated with a logical address) is referred to as valid data. In addition, data not associated with any logical address is referred to as invalid data. The valid data is data that might be read from the host 2 later. The invalid data is data that will no longer be read from the host 2.

The block management may include defective block management, wear leveling, and garbage collection.

The controller 4 may include a host interface 11, a CPU 12, and a DRAM interface 14 in addition to the NAND interface 13. The host interface 11, the CPU 12, the NAND interface 13, and the DRAM interface 14 may be interconnected via a bus 10.

The host interface 11 functions as a circuit that receives various commands such as an I/O command and various control commands from the host 2. The I/O command may include a write command and a read command.

The DRAM interface 14 functions as a DRAM controller that controls the electrical access of the DRAM 6. The storage area of the DRAM 6 is used for storing the write buffer 61, the look-up table 62, the read count table 66, and the like.

The CPU 12 is a processor that controls the host interface 11, the NAND interface 13, and the DRAM interface 14. The CPU 12 performs a variety of processing by executing a control program (e.g., firmware) stored in a ROM (not illustrated) or the like. In addition to the above-described FTL processing, the CPU 12 can perform command processing for processing various commands from the host 2. The operation of the CPU 12 may be defined by the above-described firmware executed by the CPU 12. A part or all of the FTL processing and the command processing may be performed by dedicated hardware in the controller 4.

The CPU 12 may function as a mode switching unit 121, a read control unit 122, a write control unit 123, a garbage collection (GC) control unit (referred to as a GC control unit) 124, and a refresh control unit 125. A part or all of the mode switching unit 121, the read control unit 122, the write control unit 123, the GC control unit 124, and the refresh control unit 125 may also be realized as dedicated hardware in the controller 4.

The mode switching unit 121 controls the write mode for writing data (referred to as write data) received from the host 2 into the NAND flash memory 5 according to the read count stored in the read count table 66. This write mode control is also performed when data is written into the NAND flash memory 5 through garbage collection. The write method includes a first method that can reduce the influence of read disturb stress and a second method other than the first method. Details of the first method and the second method will be described later.

The write control unit 123 performs error correction encoding on the write data and writes the encoded data into the NAND flash memory 5.

The read control unit 122 performs error correction decoding on the data read from the NAND flash memory 5 and can correct an error of the read data.

The error correction encoding and the error correction decoding may be realized as dedicated hardware in the controller 4.

The GC control unit 124 performs garbage collection (also referred to as compaction) at an appropriate timing.

The refresh control unit 125 controls the refresh operations of the blocks #0 to #(m−1) of the NAND flash memory 5 according to the read count sored in the read count table 66. Details of the refresh operation will be described later.

[Read Disturb Stress]

The reliability of data stored in the memory cell of the NAND flash memory 5 might be deteriorated by miniaturization of the memory cell size, as described below. As the number of electrons stored in one memory cell is reduced by the miniaturization, the influence of interference noise between adjacent memory cells is relatively increased. Thus, when data is read from one memory cell, the memory cells around the memory cell are stressed and the written data may be lost. Although data read is performed on a memory cell selected by a word line and a bit line, a voltage exceeding a threshold level is applied not only to the selected memory cell but also to a part of the unselected memory cells, i.e., peripheral memory cells around the selected memory cell. Accordingly, a phenomenon called read disturb might occur, in which the peripheral memory cells are weakly written, the number of electrons in a floating gate of the peripheral memory cells increases, and a threshold voltage of the peripheral memory cells becomes higher. When a read operation for a specific memory cell is performed many times, peripheral memory cells around the specific memory cell receive read disturb stress, the threshold voltage changes, and data might be able not to be correctly read from the peripheral memory cells. Since the read disturb might increase a bit error rate (referred to as BER) of the flash memory, the reliability of the memory system might be deteriorated.

The memory cells connected to the word line of a read target hardly receive read disturb stress, and the memory cells connected to two word lines adjacent to the word line of the read target might receive the largest read disturb stress. Word lines other than these three word lines uniformly receive read disturb stress. Read disturb stress is limited within one block and does not affect memory cells of the other blocks. As described above, some countermeasures are required when the influence of read disturb stress is different in the memory cells connected to the word line of the read target, the memory cells connected to the two word lines adjacent to the word line of the read target, and the memory cells connected to word lines other than these three word lines.

For example, it is assumed that read operations have been performed 10 k times only on the memory cells connected to the n-th word line and no read operation is performed on the memory cells connected to the other word lines, where k is 1,000. Due to the reading of a certain memory cell in a certain block, all the memory cells in that block receive read disturb stress. However, the memory cells connected to the n-th word line receive the weakest read disturb stress. The memory cells connected to the (n−1)-th and (n+1)-th word lines receive the strongest read disturb stress. As a result, the BER of the memory cells connected to the n-th word line, which is the read target, might be the lowest, the BER of the memory cells connected to the (n−1)-th and (n+1)-th word lines adjacent to the n-th word line might be the highest, and the BER of the memory cells connected to the word lines other than (n−1)-th, n-th, and (n+1)-th word lines might be slightly higher than the BER of the memory cells connected to the word line of the read target.

[First Countermeasure Against Read Disturb Stress]

As described above, since read disturb stress corresponds to the number of read operations (i.e., read count), the influence of the read disturb stress may be determined based on the read count. The influence of the read disturb stress received by a certain block can be canceled by refreshing the certain block. The refresh operation performed by the refresh control unit 125 is described.

The refresh control unit 125 copies data of the block influenced by read disturb stress to another block and then erases the data of the block influenced by the read disturb stress. Copy and erase may be collectively referred to as move. However, the erase is not limited to being a physical erase operation, but may include that data in the block is logically invalidated. For example, with respect to user data, by updating the address translation table, it can be regarded as completion of move when data in the block to be refreshed is no longer referred to from the address translation table. Erasing of data in the block (that is, erase processing for the block) may be performed at any timing after that. If there are no available blocks to which data is to be copied, the refresh control unit 125 searches for a free block that does not include valid data from the blocks in the NAND flash memory 5. If there is no free block, the GC control unit 124 performs garbage collection and creates a free block. Data in the free block is erased and the free block is assigned as a write destination block, and the write destination block is set as a block of data copy destination.

In the first countermeasure, the read count table 66 in the system management information 63 of the DRAM 6 is used. The read control unit 122 stores the read count of the memory cells for each block in the read count table 66. An example of the read count table 66 is illustrated in FIG. 2A.

An example of the processing of the refresh control unit 125 will be described with reference to a flowchart illustrated in FIG. 2B. The refresh control unit 125 refers to the read count table 66 in a timely manner in step S102, and determines in step S104 whether there is at least one block of which read count exceeds a first threshold. Since the reliability of written data influenced by the read disturb stress is deteriorated due to an increase in the read count, the first threshold is set to such a read count at which the reliability of the written data is not, even slightly, deteriorated below an allowable level. If it is determined in step S104 that there is no block of which the read count exceeds the first threshold, the flow returns to step S102. The first threshold may be 100 k or the like. Since the read count of the block BL #1 is 100 k, as in FIG. 2A, when a next read operation is performed on any memory cell in the block BL #1, the read count of the block BL #1 becomes 100 k+1, which exceeds the first threshold in step S104.

If it is determined in step S104 that there is at least one block of which the read count exceeds the first threshold, the refresh control unit 125 performs the refresh operation for the at least one block in step S106.

As described above, when the read count of any block, for example the block BL #1, exceeds the first threshold, data of the block BL #1 is moved to another block and the data of the block BL #1 is erased. In this manner, at least one block that has received read disturb stress is refreshed before the reliability is deteriorated below the allowable level due to the influence of read disturb stress, and thus the influence of read disturb stress is canceled. Since a write destination block to which the data of the block BL #1 is moved is the block from which the data has been erased, the read count is 0, and data is stored reliably in the write destination block.

According to the first countermeasure, since the influence of read disturb stress is canceled by the refresh process, the reliability of written data is prevented from excessively deteriorating.

[Second Countermeasure Against Read Disturb Stress]

An example of the processing of the refresh control unit 125 of a second countermeasure against read disturb stress will be described with reference to a flowchart illustrated in FIG. 3.

Similarly to the first countermeasure illustrated in FIG. 2B, the refresh control unit 125 refers to the read count table 66 in a timely manner in step S102, and determines in step S104 whether there is at least one block of which the read count exceeds the first threshold. If it is determined in step S104 that there is no block of which the read count exceeds the first threshold, the flow returns to step S102.

Unlike the first countermeasure, if it is determined in step S104 that there is at least one block of which the read count exceeds the first threshold, the refresh control unit 125 does not start the refresh operation immediately, but checks characteristics such as a bit error rate (BER) of the at least one block, indicating how much data stored in the NAND flash memory 5 is erroneous. Thus, in step S122, the refresh control unit 125 performs a scan-read operation for all the pages of the at least one block. In the scan-read operation, data is read for each page and the number of error bits for each page is obtained. Since an error is to be detected and corrected during the reading, the number of error bits for each page can be obtained. Since the number of error bits for each page of the block is related to the BER, it can be determined whether the BER exceeds a reference level by comparing the number of error bits with a second threshold. If it is found that there is at least one page of which the number of error bits exceeds the second threshold during the scan-read operation, the scan-read operation is aborted and the refresh operation is performed for the block including the page of which the number of error bits exceeds the second threshold. Note that the unit to actually count the number of error bits may be the size of data protected by the error correction coding and is not limited to the page.

In step S124, the refresh control unit 125 compares the number of error bits of each page in the at least one block of which the read count exceeds the second threshold, and determines whether there is at least one page of which the number of error bits exceeds the second threshold. If it is determined in step S124 that there is no page of which the number of error bits exceeds the second threshold, the flow returns to step S102. In this case, the first threshold used in step S104 may be changed, for example, it may be changed to be larger than the original first threshold and smaller than twice the original first threshold. This is because the influence of read disturb stress received by the block is considered to be small.

If the refresh control unit 125 determines in step S124 that there is at least one page of which the number of error bits exceeds the second threshold, it can be determined that the reliability of the written data has been deteriorated by receiving read disturb stress, and thus the refresh control unit 125 performs in step S106 the refresh operation for the block.

In the first countermeasure, if the read count of a certain block exceeds the first threshold, the certain block is refreshed. However, in the second countermeasure, even when the read count of a certain block exceeds the first threshold, if the number of error bits of any page in the certain block does not exceed the second threshold, the certain block is not refreshed. That is, a frequency of refresh operations (hereinafter referred to as refresh frequency) in the second countermeasure is lower than that in the first countermeasure. Since an access request from the host 2 might be served later by the SSD 3 during the refresh operation or the scan-read operation, these operations lower the performance (throughput or quality of service (QoS)) of the SSD 3.

In addition, since the refresh operation involves erasing of data, the number of P/E cycles excessively increases when the refresh operation is frequently performed. This might cause the number of P/E cycles of the NAND flash memory 5 to exceed the maximum number of P/E cycles guaranteed by the NAND flash memory 5. This leads to shortening the lifetime of the memory system.

Since the refresh frequency in the second countermeasure is lower than that in the first countermeasure, the performance of the SSD 3 in the second countermeasure does not deteriorate as compared with the first countermeasure, and the reliability can be maintained without shortening the lifetime.

[Third Countermeasure Against Read Disturb Stress]

As described above, the refresh operation as the countermeasure against read disturb deteriorates the performance of the SSD 3 or shortens the lifetime of the SSD 3. The scan-read operation for determining whether the refresh operation is to be executed or not also deteriorates the performance of the SSD 3 or shortens the lifetime of the SSD 3. Next, another example of suppressing the frequency of the refresh operation or the scan-read operation will be described. Heavy read disturb stress is caused by intensive read operations of the memory cells connected to a specific word line. The memory cells around a read target memory cells having a small read count are less susceptible to the influence of read disturb stress. However, even if only some memory cells in a block receive read disturb stress, the entire block is refreshed in the first and second countermeasures. Accordingly, if memory cells of intensive read target are distributed in a large number of blocks, a large number of blocks are to be refreshed.

In the third countermeasure, data is moved so that data stored in memory cells having substantially the same read frequency (or read count) can be collected in the same block. Accordingly, the refresh operation of a block due to only some of the memory cells in the block receiving heavy read disturb stress is prevented. An increase in the number of times of writing by the refresh operation can be suppressed. A decrease in lifetime due to the refresh operation caused by read disturb stress can also be suppressed. Deterioration in reliability can also be suppressed. In addition, since the refresh frequency decreases, the frequency with which the access from the host 2 to the SSD 3 is interrupted by the refresh operation is reduced, and the deterioration of performance can be reduced.

FIGS. 4A and 4B are diagrams illustrating the principle of the third countermeasure. The NAND flash memory 5 includes five blocks #0 to #4, and each block includes finer units, for example, five pages #0 to #4. Here, the read count table 66 stores the read count obtained by totaling the read counts of memory cells for each block and for each page.

As illustrated in FIG. 4A, it is assumed that each of the five blocks #0 to #4 includes pages with different read counts, and pages of which the read counts are large are uniformly distributed among the five blocks #0 to #4. In the block BL #0, the read count of the page #1 is 100 k and the read count of the other pages is 0 k. Similarly, in the block BL #1, the read count of the page #0 is 100 k and the read count of the other pages is 0 k. In the block BL #2, the read count of the page #3 is 100 k and the read count of the other pages is 0 k. In the block BL #3, the read count of the page #0 is 100 k and the read count of the other pages is 0 k. In the block BL #4, the read count of the page #4 is 100 k and the read count of the other pages is 0 k.

It is assumed that the second countermeasure is performed in this situation. It is assumed that the first threshold in step S104 in FIG. 3 is 100 k. It is assumed that the second threshold for the number of error bits in step S124 in FIG. 3 is substantially equal to the number of error bits in a case where the memory cells connected to a word line receive read disturb stress by 100 k times of read operations to its adjacent word lines. When the NAND flash memory 5 is an SLC flash memory, data of one page is written into the memory cells connected to a word line, and when the NAND flash memory 5 is other than the SLC flash memory, data of a plurality of pages are written into the memory cells connected to a word line. Here, it is assumed that the NAND flash memory 5 is an SLC flash memory. Thus, in a case where the number of error bits of one page increases to the number of error bits at the time when the read count reaches 100 k, the determination of step S124 in FIG. 3 is YES.

As illustrated in FIG. 4A, in the NAND flash memory 5 in which the cumulative read count of the five blocks #0 to #4 has reached 500 k, when subsequent several read operations are performed, the read count of a page in one of the five blocks #0 to #4 may be 100 k+1, and thus the determination result in step S104 in FIG. 3 is YES and the scan-read operation for all the pages of the one of the five blocks #0 to #4 is performed in step S122. Since the read count of the page is 100 k+1, the determination in step S124 might also be YES and the refresh operation for the one of the five blocks #0 to #4 is also performed. Due to these several read operations, all the five blocks #0 to #4 might be refreshed. That is, the NAND flash memory 5 in which the second countermeasure is performed is refreshed five times during 500 k plus several times of read operation.

FIG. 4B illustrates the read count for each page in the case of performing the third countermeasure on the NAND flash memory 5 in the state illustrated in FIG. 4A. In FIG. 4A, since there are five pages of which the read count is 100 k, data in the five pages of which the read count is large (=100 k) is moved to one block, and thus data of which the read count is 100 k is collected in one block. For example, data of the page #1 of the block BL #0, data of the page #0 of the block BL #1, data of the page #3 of the block BL #2, data of the page #0 of the block BL #3, and data of the page #4 of the block BL #4 are moved to five pages of the block BL #2. Therefore, the read count of the data stored in the five pages of the block BL #2 is 100 k. After the data is moved from the move source page to a destination page, the read count of the move source page is reset. Therefore, the read count of the five pages of the other four blocks #0, #1, #3, and #4 is all 0 k.

As illustrated in FIG. 4B, in the NAND flash memory 5 of which the cumulative read count of five blocks has reached 500 k, when subsequent several read operations are performed, the read count of the data stored in a page in the block BL #2 might be 100 k+1, and the determination result in step S104 in FIG. 3 is YES and then the scan-read operation is performed in step S122. Since the read count of the data stored in the page in the block BL #2 is 100 k+1, the determination result in step S124 might also be YES and then the refresh operation is also performed. However, in blocks other than the block BL #2, even if several read operations are performed, the scan-read operation and the refresh operation are not performed. In blocks other than the block BL #2, when read operations are performed 100 k times thereafter, the scan-read operation and the refresh operation will be performed. That is, the NAND flash memory 5 in which the third countermeasure is performed performs the scan-read operation and the refresh operation only once for 500 k plus several times of read operation.

The unit of data collected in a certain block is not limited to a page, and may be a larger unit or a smaller unit. When the NAND flash memory 5 is other than the SLC flash memory, data of a plurality of pages are written to the memory cells connected to one word line. As illustrated in FIG. 5, one block includes a large number of word lines (WL) #0, . . . , one word line includes a large number of pages #0, . . . , and one page includes a plurality of clusters #0, . . . . Each cluster includes data associated with one (or less than one) logical address range.

FIG. 6 illustrates an example of collecting data stored in the memory cells connected to word lines having substantially the same read count into the same block in the third countermeasure. It is assumed that each block includes 48 word-lines. In this case, a block/word line/read count table 66A as illustrated in FIG. 7, in which the read counts of the memory cells are totaled for each block and word line, is used instead of the read count table 66.

As described above, the influence of read disturb stress might be weakest at a read target word line WL # n, might be the strongest at the adjacent word lines WL # (n−1) and WL # (n+1), and might be uniform at the other word lines. Here, it is assumed that the scan-read operation is required when the read disturb stress from the adjacent word lines is received 100 k times. For example, a case where a management unit to manage the read count is a block unit and another case where the management unit is a word line unit will be explained. It is assumed that one block includes five word-lines and read operations for each of the five word-lines in a block has been performed 20 k times. When the management unit is the block unit, the first threshold for the read count to start the scan-read operation is set to 100 k times. If any word line in a block is subjected to a read operation, the read count for the block increases regardless which word line is subjected to the read operation. Therefore, the read count becomes larger than 100 k (=5×20 k) and the scan-read operation is started. On the other hand, when the management unit is the word line unit, the first threshold for the read count to start the scan-read operation is assumed to be set to 50 k. It any word line is subjected to a read operation, the read count for the word line increases by one. Therefore, the read count (=20 k+1) is smaller than 50 k and the scan-read operation is not started. If the memory cells connected to a word line WL # k receive the read disturb stress from an adjacent word line WL # (k+1) 50 k times and the read disturb stress from another adjacent word line WL # (k−1) 50 k times, the memory cells connected to the word line WL # k receive the read disturb stress 100 k times. In order to perform the scan-read operation in this situation, the first threshold for the read count to start the scan-read operation is set to 50 k when the management unit is the word line unit.

When the read count is managed in the word line unit, a memory size required to store the read count increases, so that the read count may be monitored and managed in the block unit so as to reduce the memory size. In that case, based on the read count managed in the block unit, a suspicious block that is likely to have a word line of which the read count is large may be extracted. Only for the suspicious block, the read count of the block may be monitored and managed in the word line unit. Furthermore, based on the read count managed in the word line unit, a suspicious word line that is likely to have a page of which the read count is large may be extracted, and only for the suspicious word line, the read count may be monitored and managed in the page unit. Furthermore, based on the read count managed in the page unit, a suspicious page that is likely to have a cluster of which the read count is large may be extracted, and only for the suspicious pages, the read count may be monitored and managed in the cluster unit. The cluster is a conceptual portion of a physical address space and is smaller than the page. A logical block address (LBA) range is a conceptual portion of a logical address space and corresponds to the cluster.

Based on the read count in the page unit, a suspicious block that is likely to have a cluster of which the read count is large may be extracted, and only for the suspect block, the read count in units of the LBA range associated with each cluster included in the block may be monitored and managed. The LBA range for monitoring and managing the read count need not be a size corresponding to the cluster (for example, 4 KB).

Figure 8:
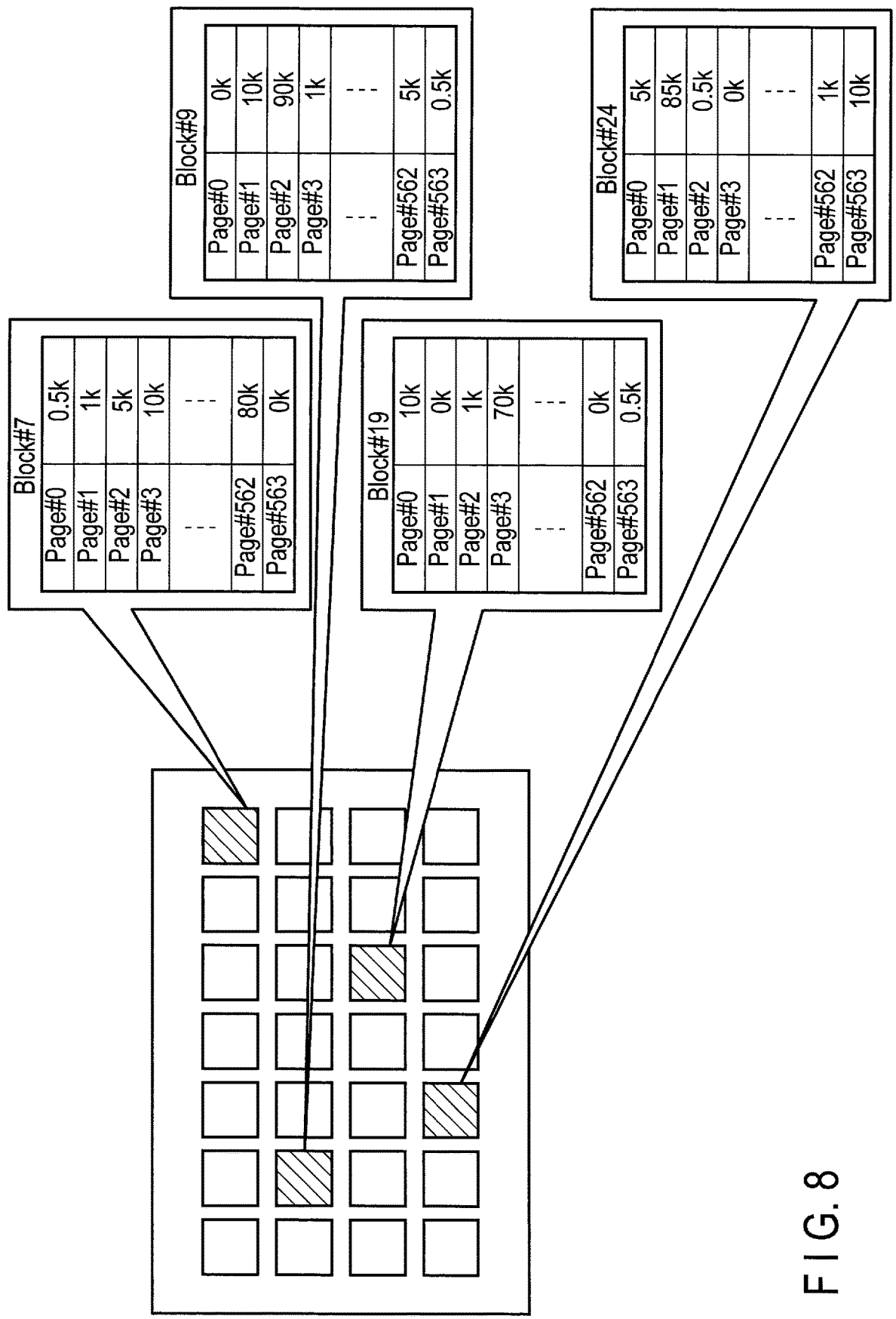
FIG. 8 is a diagram for describing an example of data movement relating to a page in the third countermeasure.

FIG. 8 illustrates an example of collecting data stored in pages having substantially the same read count into the same block in the third countermeasure. It is assumed that each block includes 564 pages. A block/page/read count table (not illustrated), in which the read counts of memory cells are totaled for each block and for each page, is used instead of the read count table 66.

Figure 9:
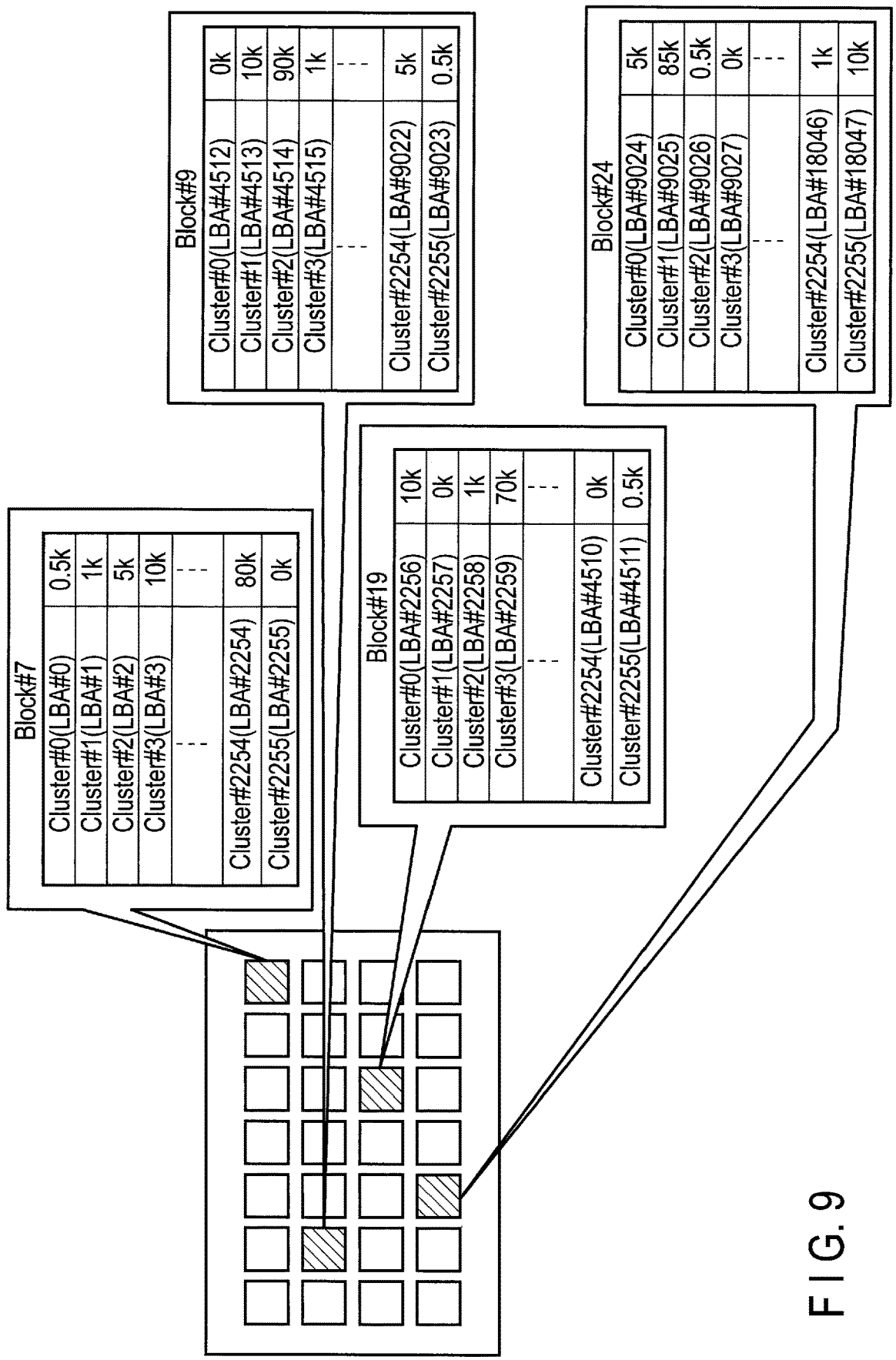
FIG. 9 is a diagram for describing an example of data movement relating to a cluster in the third countermeasure.

FIG. 9 illustrates an example of collecting data stored in clusters having substantially the same read count into the same block in the third countermeasure. As described above, the cluster is a conceptual portion of the physical address space that is smaller than the page. The logical address (LBA) range is a conceptual portion of the logical address space. An LBA range is associated with a cluster, and one LBA range stores, for example, data of 4 KB. Each block may include 2,256 clusters, i.e., 2,256 LBA ranges. A block/cluster/LBA range/read count table (not illustrated), in which the read counts of memory cells are totaled for each block and each cluster or LBA range, is used instead of the read count table 66.

Figure 10:
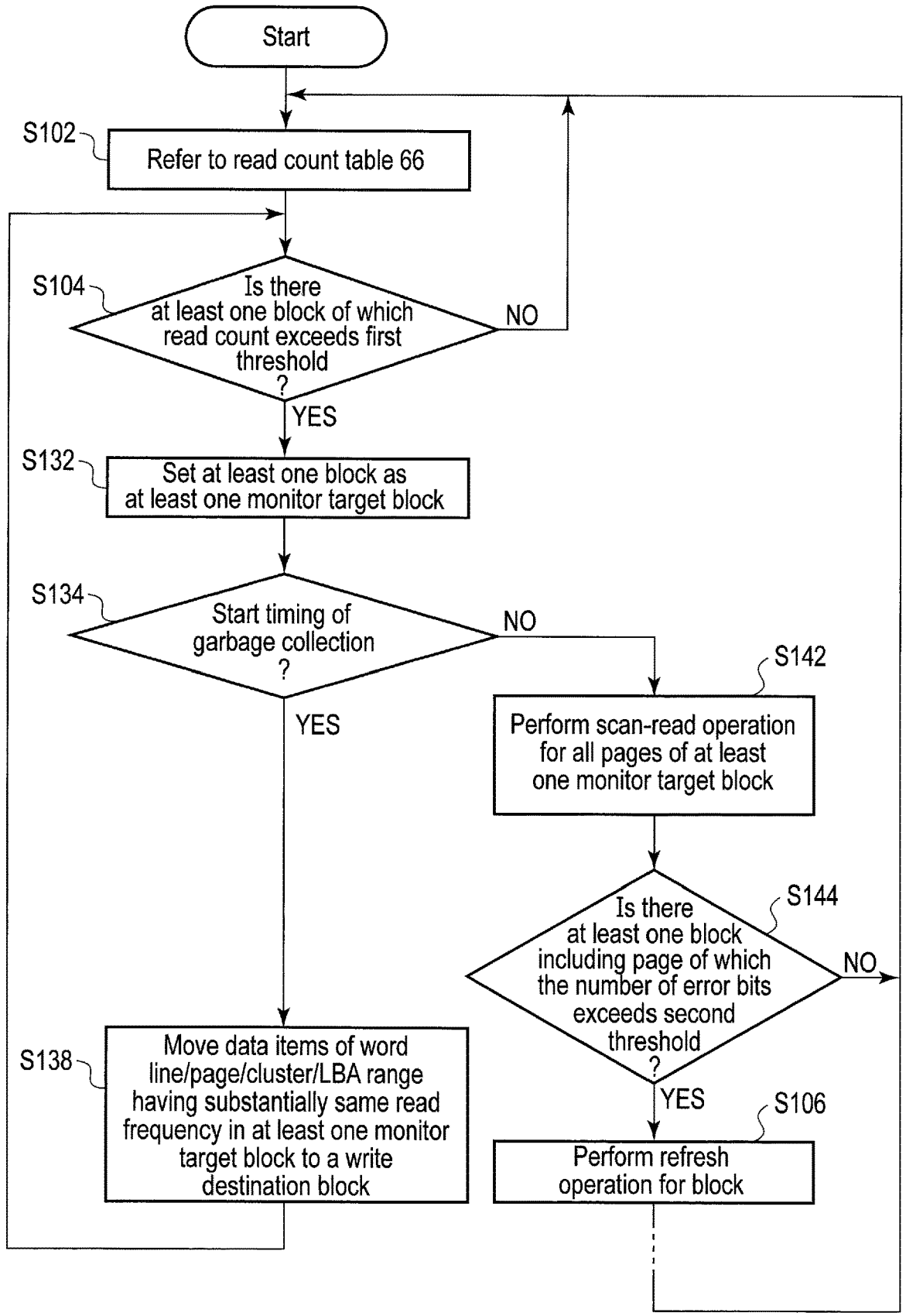
FIG. 10 is a flowchart showing an example of processing of the third countermeasure.

An example of the processing of the refresh control unit 125 to perform the third countermeasure as illustrated in FIG. 6, FIG. 8, or FIG. 9 will be described with reference to a flowchart illustrated in FIG. 10. The timing of data movement for collecting data in memory cells having substantially the same read frequency into the same block can be freely determined. It is assumed herein that the data movement is performed at the time of garbage collection.

Similarly to the first and second countermeasures, the refresh control unit 125 refers to the read count table 66 in a timely manner in step S102, and determines in step S104 whether there is at least one block of which the read count exceeds the first threshold. If it is determined that there is no block of which the read count exceeds the first threshold, the flow returns to step S102.

If it is determined in step S104 that there is the at least one block of which the read count exceeds the first threshold, the refresh control unit 125 sets the at least one block as at least one block to be monitored (hereinafter referred to as at least one monitor target block) in step S132. The management unit of the read count in the at least one monitor target block may be smaller than the management unit of at least one block not to be monitored (hereinafter referred to as at least one non-monitor target block). For example, in the at least one non-monitor target block, the read count is monitored in the block unit, and in the at least one monitor target block, the read count is monitored in the unit smaller than the block unit (for example, sub-block unit). This enables to determine, among all sub-blocks in the block, a sub-block of which the read count is the largest. A plurality blocks may be the monitor target. When the monitor target block becomes a free block, a monitor target block is managed as a non-monitor target block. In step S134, the GC control unit 124 determines whether it is a start timing of garbage collection. If the number of free blocks is less than a threshold number, the GC control unit 124 may determine that it is the start timing of garbage collection.

If the GC control unit 124 determines that it is the start timing of garbage collection, in step S138, the GC control unit 124 moves, to a write destination block, data items of the word line (or the page, cluster, or LBA range) in the at least one monitor target block having substantially the same read frequency (note that the read frequency is determined from, for example, the read count or notified from the host for each LBA range) as the process of the garbage collection. After that, the flow returns to step S104 and the GC control unit 124 determines again the read count of the block. As illustrated in FIG. 4, the execution frequencies of the scan-read operation and the refresh operation can be reduced by collecting the data items of substantially the same read count in the same block.

If the GC control unit 124 determines in step S134 that it is not the start timing of garbage collection, the refresh control unit 125 performs the scan-read operation for all the pages of the at least one monitor target block and checks the number of error bits for each page in the at least one monitor target block in step S142. In step S144, the refresh control unit 125 determines whether there is at least one page in the at least one monitor target block of which the number of error bits exceeds the second threshold. If it is determined in step S144 that there is no page of which the number of error bits exceeds the second threshold, the flow returns to step S102. If the refresh control unit 125 determines in step S144 that there is the at least one page of which the number of error bits exceeds the second threshold, the refresh control unit 125 performs the refresh operation for the at least one monitor target block in step S106.

Next, data movement other than the data movement at the time of garbage collection will be described. To move data, it is necessary to determine to what extent the block is influenced by read disturb stress, and set at least one block which is likely to be heavily influenced by read disturb stress as the monitor target block. Two examples of a method of specifying the monitor target block will be described with reference to FIGS. 11 and 12. The processing of each of FIGS. 11 and 12 is repeated at an appropriate timing.

Figure 11:
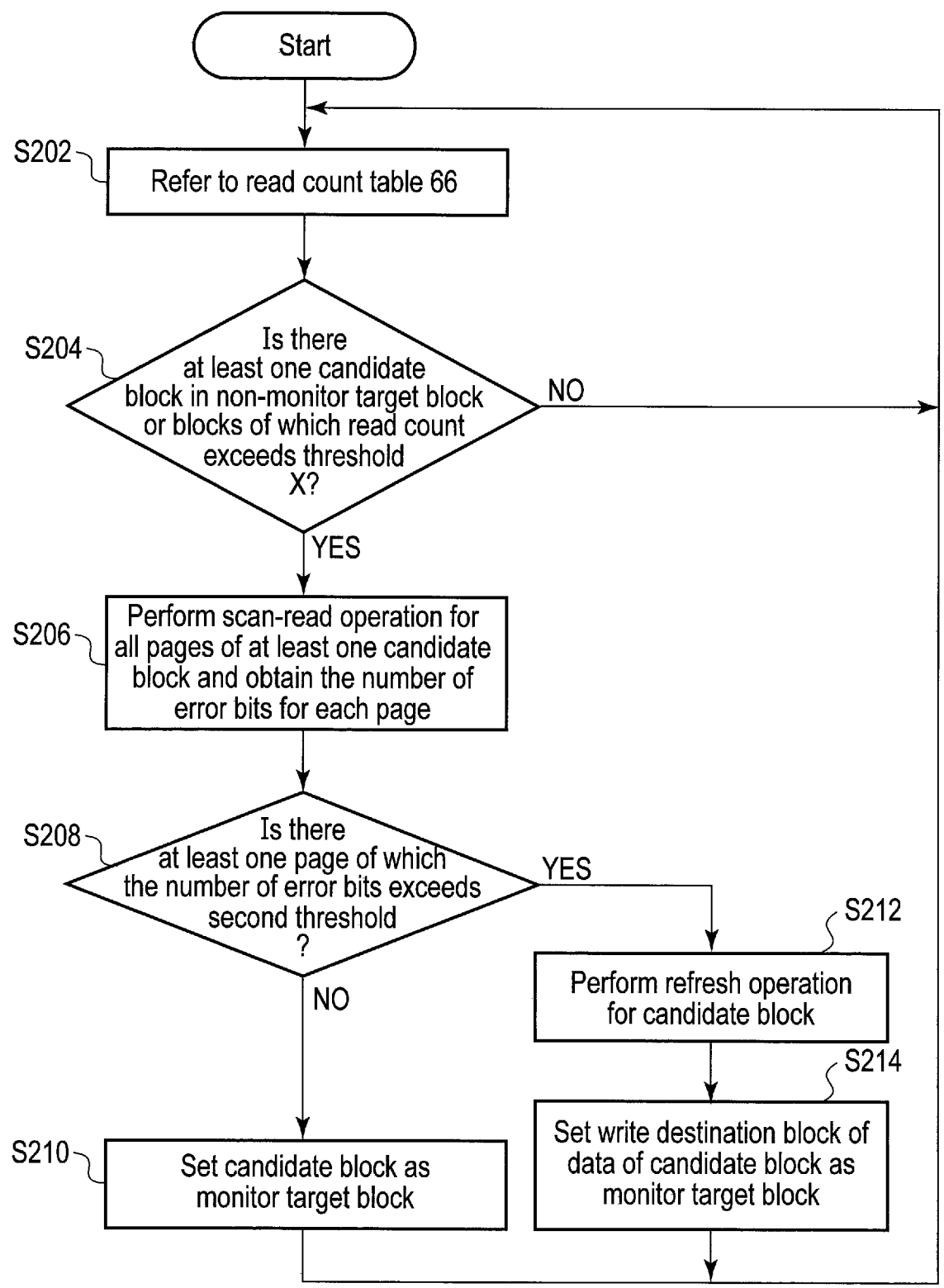
FIG. 11 is a diagram for describing an example of a method of specifying a block to be monitored.
Figure 12:
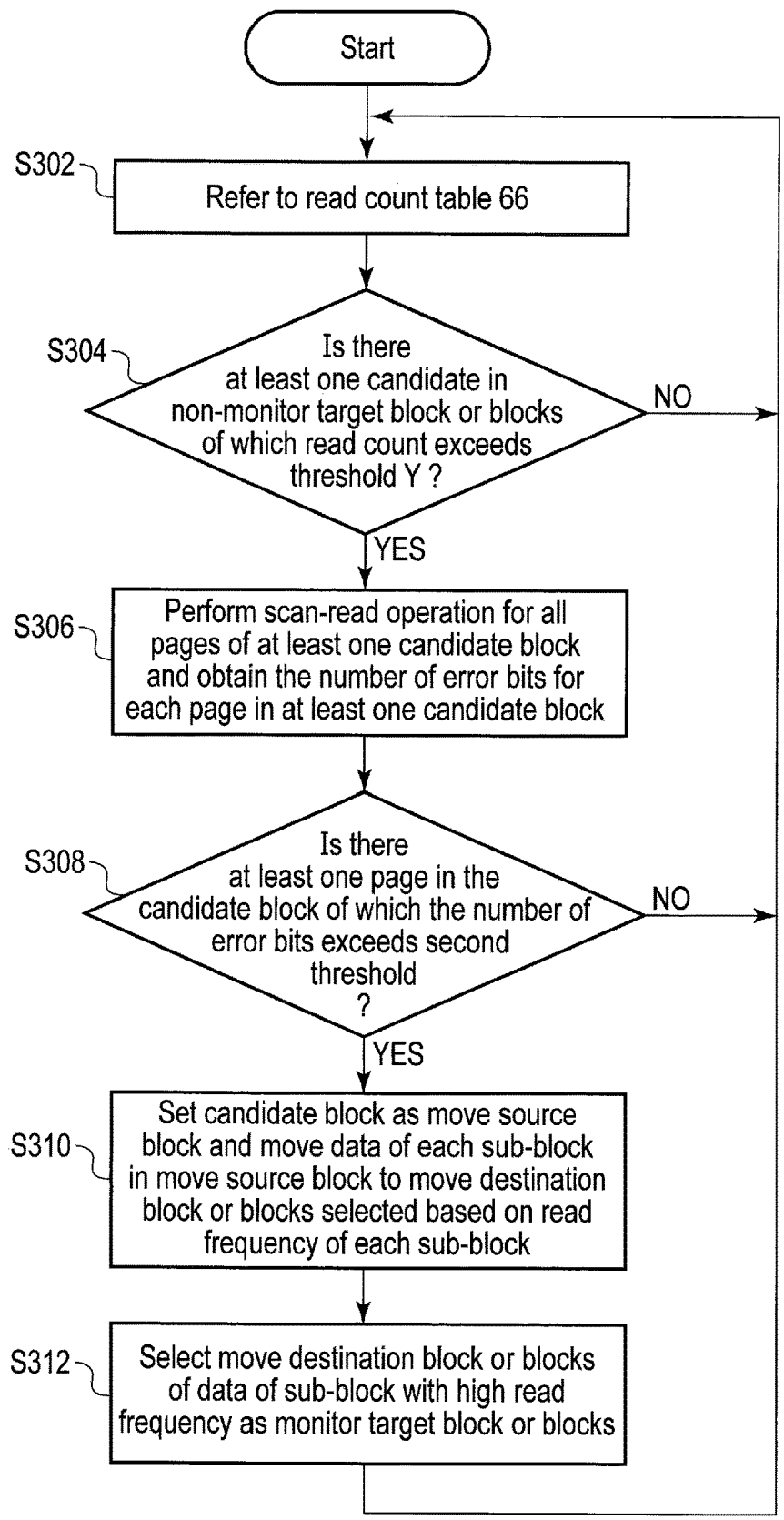
FIG. 12 is a diagram for describing another example of a method of specifying a block to be monitored.

In the example of FIG. 11, the refresh control unit 125 refers to the read count table 66 in a timely manner in step S202, and determines in step S204 whether there is at least one candidate block in the non-monitor target block or blocks of which the read count exceeds a threshold X. The non-monitor target blocks are the blocks which are other than the monitor target block and store valid data. If it is determined in step S204 that there is no candidate block, the flow returns to step S202. The threshold X determines a condition to start the scan-read operation, and may depend on the size of the management unit such as a block, a sub-block (a word line, a page, a cluster, etc.), or the like. For example, if the management unit is the word line, a threshold Xa is set, and if the management unit is the page, a threshold Xb is set. The thresholds Xa and Xb may be different from the threshold X.

If it is determined in step S204 that there is the at least one candidate block, the refresh control unit 125 performs the scan-read operation for all the pages of the at least one candidate block and obtains the number of error bits for each page in step S206. In step S208, the refresh control unit 125 compares the number of error bits of each page in each of the at least one candidate block with the second threshold, and determines whether there is at least one page in the at least one candidate block of which the number of error bits exceeds the second threshold. If it is determined in step S208 that there is no page in the candidate block of which the number of error bits exceeds the second threshold, the refresh control unit 125 sets the candidate block as a monitor target block in step S210. After that, the flow returns to step S202. At this time, the threshold X used in step S204 may be changed. For example, the threshold X may be changed to a value larger than the original X and smaller than twice the original X.

If it is determined in step S208 that there is at least one page in the candidate block of which the number of error bits exceeds the second threshold, the refresh control unit 125 performs the refresh operation for the candidate block in step S212. That is, data of the candidate block is moved to a write destination block. In step S214, the refresh control unit 125 sets the write destination block of the data of the candidate block as a monitor target block. After that, the flow returns to step S202.

In addition to the block or blocks satisfying the determination criterion illustrated in step S208 of FIG. 11, a block or blocks satisfying a determination criterion illustrated in FIG. 12 are also specified as the monitor target block. In the example of FIG. 12, in step S302, the refresh control unit 125 refers to the read count table 66 in a timely manner, and in step S304, the refresh control unit 125 determines whether there is at least one candidate block in the non-monitor target block or blocks of which the read count exceeds a threshold Y. If it is determined in step S304 that there is no candidate block, the flow returns to step S302. If the read count is monitored in units of smaller than the block for the non-monitor target block or blocks, the non-monitor target block or blocks may also be subjected to processing in step S304 and subsequent steps.

If it is determined in step S304 that there is at least one candidate block, the refresh control unit 125 performs the scan-read operation for all the pages of the at least one candidate block and obtains the number of error bits for each page in the at least one candidate block in step S306. In step S308, the refresh control unit 125 compares the number of error bits of each page in the candidate block with the second threshold, and determines whether there is at least one page in the candidate block of which the number of error bits exceeds the second threshold. If it is determined in step S308 that there is no page in the candidate block of which the number of error bits exceeds the second threshold, the flow returns to step S302. At this time, the threshold Y used in step S304 may be changed. For example, the threshold Y may be changed to a value larger than the original Y and smaller than twice the original Y.

If it is determined in step S308 that there is at least one page in the candidate block of which the number of error bits exceeds the second threshold, the refresh control unit 125 sets the candidate block (i.e., a block to be refreshed) as a move source block and moves data of each sub-block included in the move source block to a move destination block or blocks selected based on the read frequency of each sub-block in step S310. In addition to the block to be refreshed, the move source block may further include a block which satisfies a condition to be described later (for example, a block in which the number of pages of which the read frequency is high is the largest among at least one monitor target block). In step S312, the refresh control unit 125 selects the move destination block or blocks of data of the sub-block with a high read frequency as the monitor target block or blocks.

Figure 13:
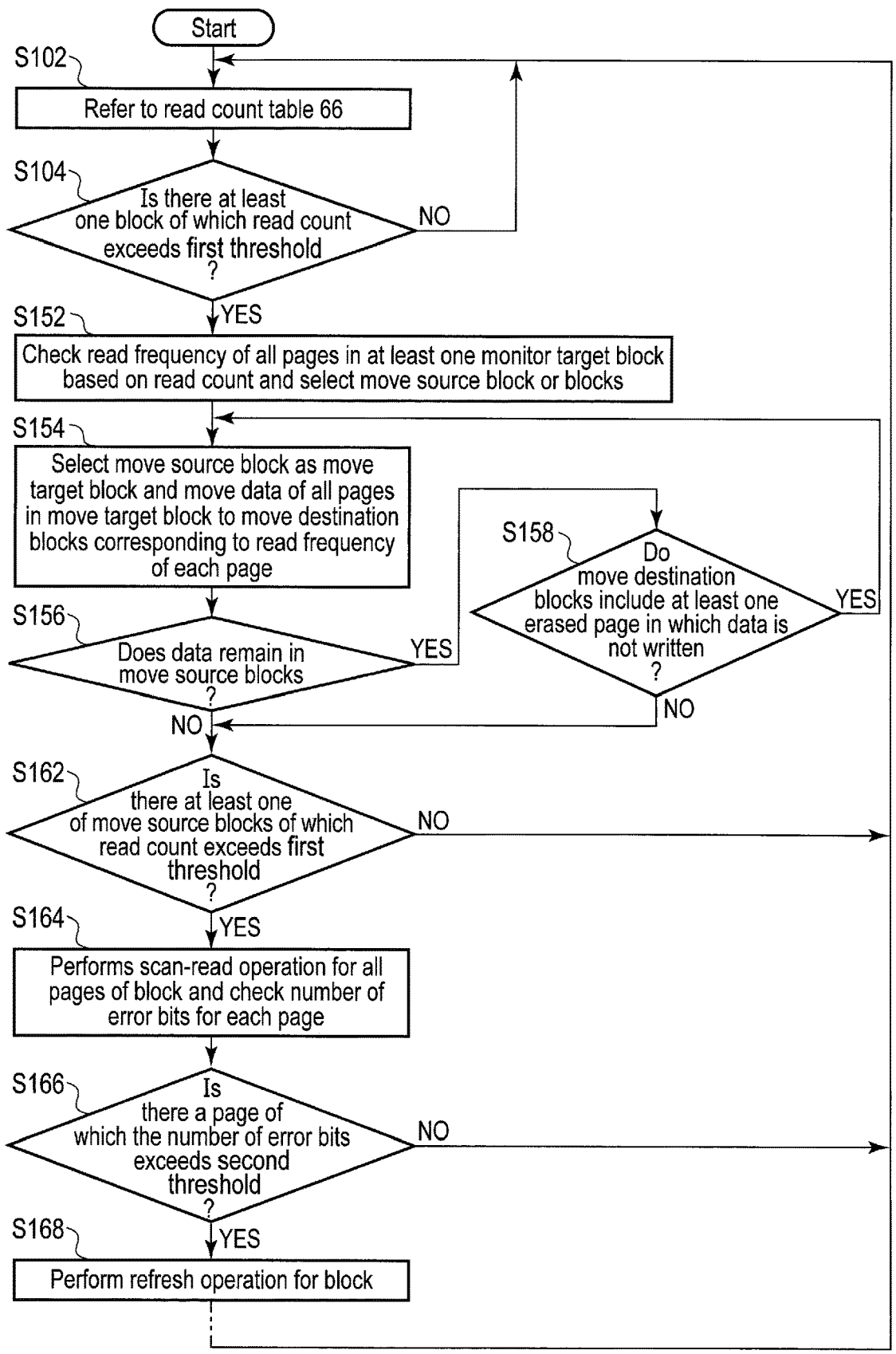
FIG. 13 is a flowchart for describing an example of a process of collecting data items determined to have different read frequencies into the same block in the third countermeasure.

An example of processing of collecting data items of different read frequencies into the same block for each read frequency will be described with reference to FIGS. 13 to 18. FIG. 13 is a flowchart of data movement processing. FIGS. 14 to 18 are diagrams that describe the move source block (also referred to as a block to be moved or a move target block) and the move destination block of the data movement. In FIGS. 14 to 18, a page of which the read frequency is high is indicated by a crosshatch and a page of which the read frequency is low is indicated by a hatch. A blank page is indicative of erased page that stores no data. In FIG. 13, the timing of data movement is not the time of garbage collection but the time of detecting the block or blocks to be refreshed, which include at least one page of which the number of error bits exceeds the second threshold.

It is assumed that block BL #0 in FIG. 14 is detected as the block to be refreshed. Here, the unit of data for movement is a page. Therefore, the read count table 66 is a block/page/read count table. The write destination block to which data is to be moved includes a move destination block of data of a page of which the read frequency is high, and a move destination block of other data.

As illustrated in FIG. 13, similarly to the first and second countermeasures, the refresh control unit 125 refers to the read count table 66 in a timely manner in step S102, and determines in step S104 whether there is at least one block of which the read count exceeds the first threshold. If it is determined in step S104 that there is no block of which the read count exceeds the first threshold, the flow returns to step S102.

If it is determined that there is at least one block of which the read count exceeds the first threshold, the refresh control unit 125 refers to the block/page/read count table and checks the read frequency of all the pages in the at least one monitor target block based on the read count in the block/page/read count table in step S152. In step S152, the refresh control unit 125 further selects a monitor target block or blocks of which the number of pages with a high read frequency is large and a block to be refreshed as a move source block or blocks. It is assumed that the blocks BL #0 to BL #4 illustrated in FIG. 14 are selected as the move source blocks by the processing of FIGS. 11 and 12. Upon completion of step S152, it is assumed that the read frequency of each page of the move source blocks is in a state illustrated in FIG. 14. The read frequencies are classified into several frequencies, for example, a high read frequency and others. The number of pages of which the read frequency is high is four in the block BL #0, two in the block BL #1, one in the block BL #2, two in the block BL #3, and three in the block BL #4.

The refresh control unit 125 selects one of the move source blocks as the move target block. For example, the refresh control unit 125 first selects a block to be refreshed (herein, BL #0) as the move target block and moves data of all the pages in the move target block BL #0 to the move destination blocks corresponding to the read frequency of each page in step S154. In the state of FIG. 14, data of four pages of the block BL #0 of which the read frequency is high are moved to the block BL #100, and data of six pages of the block BL #0 of which the read frequency is low are moved to block BL #101. The state after the movement is illustrated in FIG. 15.

In step S156, the refresh control unit 125 determines whether data remains in the move source blocks. In the state of FIG. 15, data remains in the blocks BL #1 to BL #4. If the refresh control unit 125 determines in step S156 that data remains in the move source blocks, the refresh control unit 125 determines in step S158 whether the move destination blocks BL #100, BL #101, BL #102, and BL #103 include at least one erased page in which the data is not written. If the refresh control unit 125 determines in step S158 that the move destination blocks BL #100, BL #101, BL #102, and BL #103 do not include the erased page, the refresh control unit 125 performs step S162.

If the refresh control unit 125 determines in step S158 that the move destination blocks BL #100, BL #101, BL #102, and BL #103 include at least one erased page, the refresh control unit 125 performs step S154 again to select one of the move source blocks in which the number of pages with a high read frequency is the largest as the move target block and moves data of all the pages in the move target block to the move destination blocks. In the state of FIG. 15, the block BL #4 is selected as the move target block since it includes three pages of which the read frequency is high. For the move target block BL #4, data of three pages of which the read frequency is high are moved to the block BL #100, and data of seven pages of which the read frequency is low are moved to the blocks #101 and #102. The state after the movement is illustrated in FIG. 16. It is not always necessary to move data of all the pages in the move target block in step S154. For example, data of a page of which the read frequency is not high need not be moved. In addition, at the time of the second and subsequent executions of step S154, data of a page of which the read frequency is not high does not have to be moved.

In step S156, the refresh control unit 125 determines whether data remains in the move source blocks. In the state of FIG. 16, data remains in the blocks BL #1 to BL #3, and the move destination blocks BL #102 and BL #103 include at least one erased page. Therefore, the refresh control unit 125 performs step S154 again to select one of the move source blocks in which the number of pages with a high read frequency is the largest as the move target block and moves data of all the pages in the move target block to the move destination blocks. In the state of FIG. 16, the block BL #1 is selected as the move target block. For the move target block BL #1, data of two pages of which the read frequency is high are moved to the move destination block BL #100, and data of eight pages of which the read frequency is low are moved to the move destination blocks #102 and #103. The state after the movement is illustrated in FIG. 17.

In step S156, the refresh control unit 125 determines whether data remains in the move source blocks. In the state of FIG. 17, data remains in the blocks BL #2 and BL #3, and the move destination block BL #103 includes at least one erased page. Therefore, the refresh control unit 125 performs step S154 again to select one of the move source blocks in which the number of pages with a high read frequency is the largest as the move target block and moves data of all the pages in the move target block to the move destination blocks. In the state of FIG. 17, the block BL #3 is selected as the move target block. Since the number of erased pages of the move destination block BL #100 for data items determined to have a high read frequency is one, the data of two pages of which the read frequency is high in the block BL #3 are dividedly moved to the move destination block BL #100 for data items determined to have a high read frequency and the move destination block BL #103 for data items determined to have a low read frequency. Data of eight pages in the block BL #3 of which the read frequency is low are moved to the move destination block BL #103 for data items determined to have a low read frequency. The state after the movement is illustrated in FIG. 18.

In the state of FIG. 18, data remains in the move source block BL #2, but data is written in all the pages of the move destination blocks BL #100, BL #101, BL #102, and BL #103. Therefore, the determination in step S158 is NO and the refresh control unit 125 does not perform step S154 and instead performs step S162. That is, data movement relating to the block BL #2 is terminated.

In step S162, the refresh control unit 125 determines whether there is at least one of the move source blocks of which the read count exceeds the first threshold. If it is determined in step S162 that there is no block of which the read count exceeds the first threshold, the flow returns to step S102.

If it is determined in step S162 that there is at least one of the move source blocks of which the read count exceeds the first threshold, the refresh control unit 125 performs the scan-read operation for all the pages of the at least one of the move source blocks in step S164. In step S166, the refresh control unit 125 compares the number of error bits of each page of the block with the second threshold, and determines whether there is a page of which the number of error bits exceeds the second threshold. If it is determined in step S166 that there is no page of which the number of error bits exceeds the second threshold, the flow returns to step S102.

If it is determined that there is at least one page of which the number of error bits exceeds the second threshold, the refresh control unit 125 performs the refresh operation for the block including such a page in step S168.

Due to such data movement, the execution frequency of the refresh operation in step S168 can be reduced, the lifetime is not shortened, and the reliability of data can be maintained without deteriorating the performance.

In the descriptions of FIGS. 14 to 18, other than the block to be refreshed, the block in which the number of pages of which the read frequency is high is the largest is selected as the move target block. The modification of the move target block will be described with reference to FIGS. 19 and 20. In FIG. 17, the block BL #3 in which the number of pages with a high read frequency is the largest (=two) is selected as the move target block. However, the move target block may be selected in consideration of how data is written to the pages of the move destination block BL #100 for data items determined to have a high read frequency. FIG. 19 illustrates the move destination block BL #100 in which data is written as in FIG. 17. However, since only one erased page remains in the move destination block BL #100, the block BL #2 including only one page of which the read frequency is high rather than the block BL #3 including two pages of which the read frequency is high is selected as the move target block. Data of one page of the block BL #2 of which the read frequency is high is moved to the move destination block BL #100 for data items determined to have a high read frequency. Data of nine pages of the block BL #2 of which the read frequency is low are moved to the move destination block BL #103 for data items determined to have a low read frequency. The state after the movement is illustrated in FIG. 20.

As described above, according to the third countermeasure, data in a particular sub-block is not read intensively, but data in all the sub-blocks are read substantially equally. Therefore, the frequency of the refresh operation can be decreased. In addition, the read counts of a large number of blocks do not increase substantially evenly, but the read counts of only a few blocks increase. Therefore, the execution frequency of the scan-read operation can also be decreased.

[Fourth Countermeasure Against Read Disturb Stress]

In the second and third countermeasures, it is determined whether to perform the refresh operation by comparing characteristics indicative of the extent to which data stored in the NAND flash memory 5 is incorrect and a threshold as well as by comparing the read count of the block and a threshold. That is, if the reliability of data stored in the NAND flash memory 5 is high, there is a high probability that the refresh operation will not be performed. Therefore, when data is written into the NAND flash memory 5, the execution frequency of the refresh operation can be reduced by using a write method that is highly reliable in written data and can reduce the influence of read disturb stress. A write method having high reliability of data may be used for all data. However, since such a write method has a time-consuming problem or the like, a write method having high reliability of data may be used to write data items determined to have a high read frequency, and a normal write method may be used for other data items.

An example of a write method having high reliability of data will be described.

FIGS. 21A and 21B are diagrams illustrating threshold voltage distributions of memory cell transistors in a TLC flash memory as a comparative example. The horizontal axis of the threshold voltage distributions indicates a threshold voltage of the memory cells and the vertical axis thereof indicates the number of the memory cells having the same threshold voltage. The memory cell transistor can hold 3-bit data based on threshold voltages. Data expressed by 3 bits are referred to as an "Er" state, an "A" state, a "B" state, a "C" state, a "D" state, an "E" state, an "F" state, and a "G" state in ascending order of the threshold voltages. The "Er" state, the "A" state, the "B" state, the "C" state, the "D" state, the "E" state, the "F" state, and the "G" state correspond to 3-bit data "111", "110", "100", "000", "010", "011", "001", and "101", respectively. Data of each bit is written in each page. FIG. 21A illustrates threshold voltage distributions in a state where no read disturb stress is exerted. The waveform of the threshold voltage distribution of each state is substantially bilaterally symmetrical. Two waveforms of adjacent states do not need to be continuous, and a blank portion may be present between two adjacent waveforms which are separated from each other. When read disturb stress is exerted, the threshold voltage of the memory cell becomes higher. Thus, as indicated by a dashed lines in FIG. 21B, the right portion (i.e., higher threshold voltage portion) of the waveform of threshold voltage distribution of each state extends to the high voltage side. A substantially bilaterally symmetrical waveform of threshold voltage distribution of each state is changed to a bilaterally asymmetrical waveform in which the higher threshold voltage portion overlaps the left portion (i.e., lower threshold voltage portion) of the right-adjacent (i.e., higher voltage side) waveform. How much the waveform changes varies from state to state. The lower the center voltage of the waveform of the threshold voltage distribution (e.g., the "Er" state, "A" state, and "B" state), the more the waveform changes. The waveform of threshold voltage distribution of the state with a low center voltage more overlaps the waveform of threshold voltage distribution of the adjacent state. In the portion where the waveforms of the threshold voltage distribution overlap, data cannot be correctly read, and the reliability of the data is deteriorated. Accordingly, the lower the center voltage of the waveform of the threshold voltage distribution, the more deteriorated the reliability of the data.

The reason why the reliability of the data is deteriorated by read disturb stress as described above is that the waveform of the threshold voltage distribution changes and overlaps the waveform of the adjacent waveform of the threshold voltage distribution. Thus, if data is written so that the waveforms of the threshold voltage distributions become narrower as illustrated by solid lines in FIG. 22A, the waveform little overlaps the adjacent waveform and the reliability of the data is little deteriorated. Dashed lines in FIG. 22A indicate the normal threshold voltage distributions as described in FIG. 21A.

In writing data into the NAND flash memory cell, a program voltage is applied to the memory cell, and thus the threshold voltage of the memory cell increases. It is determined whether the left end (lowest threshold voltage) of the threshold voltage distribution of a target state exceeds a program-verify reference voltage. If not exceeding, the program voltage is slightly increased. The program voltage is gradually increased until the left end of the threshold voltage distribution exceeds the program-verify reference voltage.

Figure 23:
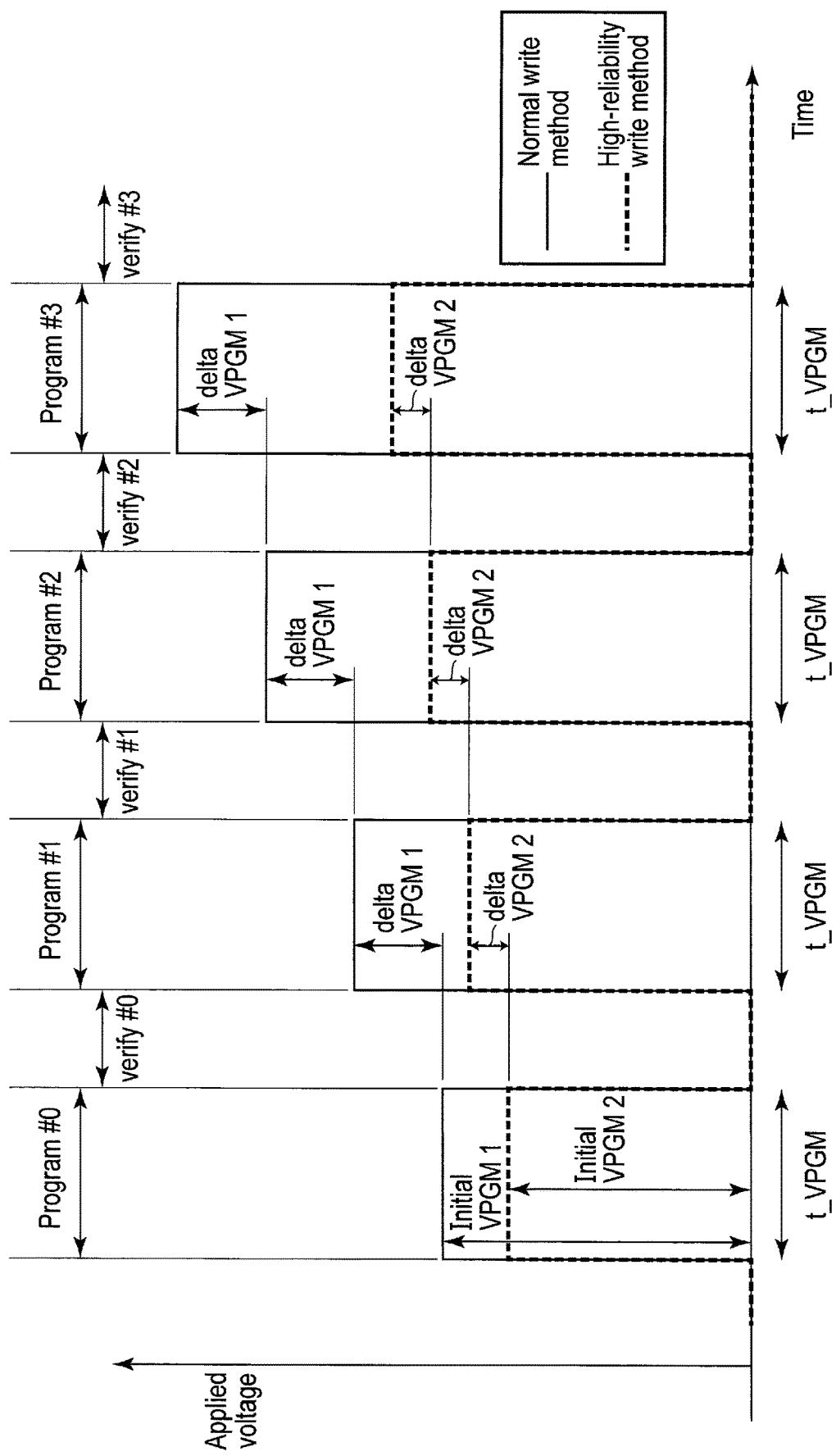
FIG. 23 is a diagram illustrating an example of a method of writing data with high reliability in the fourth countermeasure.

Here, if the step of increasing the program voltage is small, the number of times the program voltage is applied until the left end of the threshold voltage distribution exceeds the program-verify reference voltage is large. According to such a write method, although the program time increases, a width (i.e., variation) of the waveform of the threshold voltage distribution in the horizontal axis can be made narrower. In writing data, an initial value of the program voltage "initial VPGM" is applied to the memory cell, a certain number of charges are initially given to a floating gate, and the threshold voltage increases to a certain voltage. After that, the program voltage increased by a small voltage "delta VPGM" is applied to the memory cell, the charges are gradually given to the memory cell, and the threshold voltage is raised to the target voltage. FIG. 23 illustrates a difference of program voltages between the normal write method for realizing the threshold voltage distributions illustrated in FIG. 21A and the high reliability write method for realizing the threshold voltage distributions illustrated in FIG. 22A. The initial value of the program voltage "initial VPGM2" in the high reliability write method is lower than the initial value of the program voltage "initial VPGM1" in the normal write method. The increment of the program voltage "delta VPGM2" in the high reliability write method is smaller than the increment of the program voltage "delta VPGM1" in the normal write method. As described above, when the initial value of the program voltage "initial VPGM2" and the increment of the program voltage "delta VPGM2" in the high reliability write method are made smaller than those in the normal write method and the charges are gradually injected, the number of injections increases (i.e., program time increases), but a variation in the number of injected charges between memory cells can be reduced. Accordingly, the waveform of the threshold voltage distribution can be made narrower, and the reliability can be improved. It is not limited to making both the initial value of the program voltage "initial VPGM2" and the increment of the program voltage "delta VPGM2" in the high reliability write method smaller than those in the normal write, and only one of the initial value of the program voltage "initial VPGM2" and the increment of the program voltage "delta VPGM2" may be made smaller than that in the normal write.

Data items determined to have a high read frequency may be written by the high reliability write method illustrated in FIG. 22A, and the other data may be written by the normal write method illustrated in FIG. 21A.

Figures 24A, 24B:
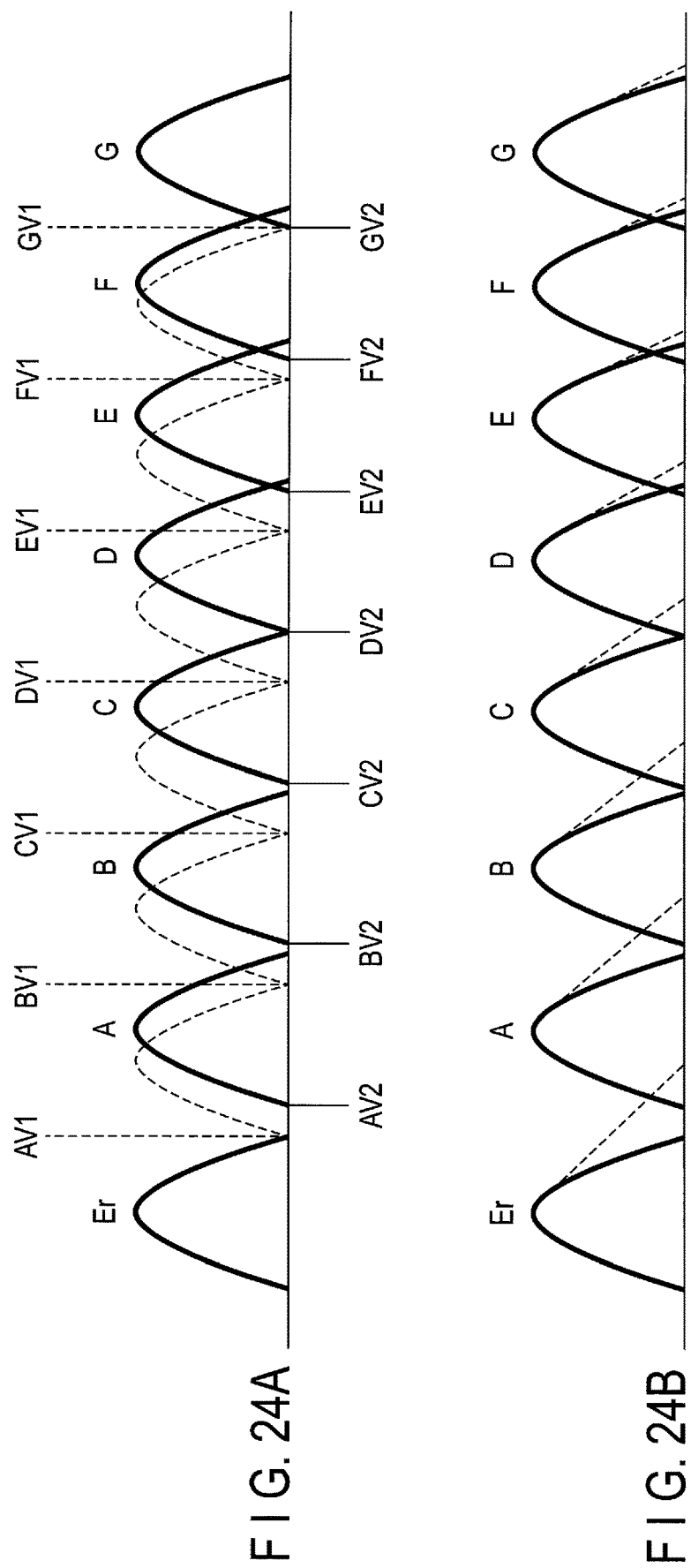
FIGS. 24A and 24B are diagrams illustrating an example of threshold voltage distributions of memory cell transistors in a method of writing data with high reliability in the fourth countermeasure.

The dashed waveform in FIG. 24A indicates the normal threshold voltage distribution of FIG. 21A. As illustrated in FIG. 21B, the lower the center voltage of the waveform of the threshold voltage distribution of each state, the more the higher threshold voltage portion of the waveform changes if read disturb stress is exerted. Accordingly, the waveforms of the threshold voltage distributions of states with lower center voltages more overlap the waveform of threshold voltage distribution of the adjacent state if read disturb stress is exerted. If data is written so that the waveforms of the threshold voltage distributions of states with lower center voltages are shifted to the high voltage side, an amount of overlapping the waveforms of the threshold voltage distributions with the adjacent states due to read disturb stress can be reduced. Accordingly, the high reliability write method can be realized. By setting the program verify reference voltages AV2, BV2, CV2, DV2, EV2, FV2, and GV2 at appropriate positions for each state, as indicated by the solid lines in FIG. 24A, data can be written so that the waveforms of the threshold voltage distributions of states with lower center voltages are shifted to the high voltage side, the margin between the waveforms of the threshold voltage distributions of the adjacent states are increased for states with the lower center voltage, and the difference between the program-verify reference voltages of the adjacent states are increased for states with the lower center voltage. For example, the difference between the program-verify reference voltage AV2, which is between the "Er" state and the "A" state, and the program-verify reference voltage BV2, which is between the "A" state and the "B" state, in the high reliability write method indicated by the solid lines in FIG. 24A is larger than the difference between the program-verify reference voltage AV1, which is between the "Er" state and the "A" state, and the program-verify reference voltage BV1, which is between the "A" state and the "B" state, in the normal write method indicated by the dashed lines in FIG. 24A.

When data is written by using such a program-verify reference voltage, as illustrated in FIG. 24B, if the threshold level of the memory cell is changed by read disturb stress and the waveform of the threshold voltage distribution for each state changes, the amount of overlapping with the adjacent waveform becomes smaller than that in FIG. 21B. For example, the intersection of the "Er" state waveform and the "A" state waveform in FIG. 24B is lower in the vertical axis direction than that in FIG. 21B. Therefore, the number of error bits in FIG. 24B is smaller than that in FIG. 21B and the deviation in the number of error bits for each state is reduced. Regarding the intersections of the "E" state waveform, the "F" state waveform, and the "G" state waveform, the intersection of the waveforms of two of these three states in FIG. 24B is higher in the vertical axis direction than that in FIG. 21B. However, since the condition to start the refresh operation is chiefly determined by blocks having a large number of error bits and an average of the numbers of error bits for all the states are reduced, it is possible to lower the refresh frequency.

Data items determined to have a high read frequency may be written by the high reliability write method using the program-verify reference voltages indicated by the solid lines in FIG. 24A, and the other data may be written by the normal write method using the program-verify reference voltages indicated by the dashed lines in FIG. 24A.

The write methods of FIGS. 22A and 22B and FIGS. 24A and 24B may be used in combination. That is, data may be written so that the waveform of the threshold voltage distribution is narrowed and the distribution itself is shifted to the high voltage side.

Although not illustrated, another example of a write method having high reliability of data may include reducing the number of bits of data stored in one nonvolatile memory cell. For example, when the NAND flash memory 5 is an MLC/TLC/QLC flash memory, the mode switching unit 121 may switch the write mode between the SLC mode and the MLC/TLC/QLC mode. When the NAND flash memory 5 is a TLC/QLC flash memory, the mode switching unit 121 may switch the write mode among the SLC mode, the MLC mode, and the TLC/QLC mode. When the NAND flash memory 5 is a QLC flash memory, the mode switching unit 121 may switch the write mode among the SLC mode, the MLC mode, the TLC mode, and the QLC mode.

Data items determined to have a high read frequency may be written in a mode in which the number of bits of data stored in one nonvolatile memory cell is small, and the other data may be written in a mode in which the number of bits of data stored in one nonvolatile memory cell is large. For example, data items determined to have a high read frequency may be written in the MLC mode or the TLC mode, and the other data may be written in the TLC/QLC mode or the QLC mode.

Although not illustrated, another example of a write method having high reliability of data is a write method using an error correction code (ECC) having a high correction capability. The ECC provided in the read control unit 122 and the write control unit 123 may vary the correction capability. Data items determined to have a high read frequency may be written by using the ECC having a high correction capability, and the other data may be written by using the ECC having a low correction capability.

An example of selecting a data write method according to the read frequency will be described with reference to FIGS. 25 and 26. FIGS. 25 and 26 illustrate state transitions of blocks. When data is written into an erased block, the state of the erased block changes to a written state. When data is erased from the written block, the state of the written block changes to an erased state. In FIG. 25, the erased block into which the data items determined to have a high read frequency is to be written and the erased block into which the other data is to be written are separate and fixed. FIG. 26 illustrated an example in which each erased block can be used as a write destination block for writing data items determined to have a high read frequency or as a write destination block for writing the other data.

Write operation may include a host write operation in which data from the host 2 is written and a write operation by garbage collection. In the case of the host write operation, when a write command is issued, information about the read frequency together with the data may be supplied from the host 2 to the controller 4. In the case of the write operation by garbage collection, it is possible to obtain the information about the read frequency from the read count for each word line, page, cluster, or LBA range. In the above description, the information about read frequency is supplied from the host 2 together with the write command, but it may be notified from the host 2 in association with the LBA range. In this case, the LBA range notified from the host 2 need not be the size of the cluster unit (e.g., 4 KB).

The data items determined to have a high read frequency may be written by a write method having high reliability of data, and other data may be written by other write methods. The method of writing data items determined to have a high read frequency may be at least one of (i) a write method in which the number of bits of data stored by one nonvolatile memory cell is small (for example, the SLC mode), (ii) a write method using the ECC having a high error correction capability, (iii) a write method in which the waveform of the threshold voltage distribution for each state becomes narrower than usual as indicated by the solid lines of FIG. 22A, and (iv) a write method in which the difference between the program-verify reference voltages of the adjacent states becomes larger so that the margin is widened as the center voltage of the state is lowered, as illustrated by the solid lines in FIG. 24A. The other data write methods may include at least one of (i) a write method in which the number of bits of data stored in one nonvolatile memory cell is large (for example, the MLC/TLC/QLC mode) and (ii) a write method using an ECC having a low error correction capability.

According to the fourth countermeasure (countermeasures other than the countermeasure using the ECC having a high error correction capability), the deterioration of the BER of data (i.e., increase in the number of error bits) in the NAND flash memory 5 is suppressed, or increasing of the BER for only a specific page is prevented. As a result, the possibility of being determined to perform the refresh operation due to the result of the scan-read operation is reduced, and the execution frequency of the refresh operation can be reduced. In the case of using the ECC having a high error correction capability, it is possible to correct data with a higher BER (i.e., data with the larger number of error bits) than the case of using the ECC having a normal error correction capability. Thus, it is possible to set the first threshold of the read count for starting the scan-read operation to be larger, as compared with the case of using the ECC having the normal error correction capability. In addition, since the criterion for determining that the refresh operation is to be performed as a result of the scan-read operation can be lowered, the frequency of the scan-read operation or the frequency of the refresh operation can be reduced. That is, in the case of using the ECC having a high error correction capability, the deterioration of the probability of correction failure is prevented, the possibility of being determined to perform the refresh operation due to the result of the scan-read operation is reduced, and thus the execution frequency of the refresh operation can be reduced.

[Fifth Countermeasure Against Read Disturb Stress]

A combination of the third and fourth countermeasures will be described as a fifth countermeasure. That is, when data items determined to have substantially the same read frequency are moved to one write destination block, the write method may be selected according to the read frequency. Even with the fourth countermeasure, the deterioration of the BER (i.e., increase in the number of error bits) due to the influence of read disturb stress occurs. According to the fifth countermeasure, the increase amount of the BER due to read disturb stress can be reduced, or increasing of the BER for only a specific page is prevented. As a result, the refresh frequency is reduced.

FIGS. 27A and 27B are diagrams illustrating the principle of the fifth countermeasure. The NAND flash memory 5 includes five blocks #0 to #4, and each block includes five pages #0 to #4. Here, the read count table 66 stores the read count obtained by totaling the read counts of memory cells for each block and for each page.

As illustrated in FIG. 27A, it is assumed that each of the five blocks #0 to #4 includes five pages having different read counts, and pages of which the read count is large are uniformly distributed among the five blocks #0 to #4. In the block #0, the read count of the page #1 is 98 k and the read count of the other pages is 0.5 k. Similarly, in the block #1, the read count of the page #0 is 80 k and the read count of the other pages is 5 k. In the block #2, the read count of the page #3 is 83.5 k and the read count of the other pages is 10 k or less. In the block #3, the read count of the page #0 is 74 k and the read count of the other pages is 1 k. In the block #4, the read count of the page #4 is 60 k and the read count of the other pages is 10 k.

FIG. 27B illustrates the read count for each page in the case of performing the fifth countermeasure on the NAND flash memory 5 from the state illustrated in FIG. 27A. As illustrated in FIG. 27B, the data of the pages in each block of which the read count is the largest are collected into the block #2. The data of the pages in each block of which the read count is the next largest are collected into the block #4. Similarly, the data of the pages in each block of which the read counts are substantially the same are collected into the blocks #0, #1, and #3.

When the data of the pages in each block of which the read count is the largest are written into the block BL #2, three of the write methods having high data reliability may be used together. When the data of the pages in each block of which the read count is the next largest are written into the block BL #4, two of the write methods having high data reliability may be used together. When the data of the pages in each block of which the read count is the third largest are written into the block BL #1, one of the write method having high data reliability may be used. When the data are written into the other blocks, the normal write method other than the write method having high data reliability may be used.

Figure 28:
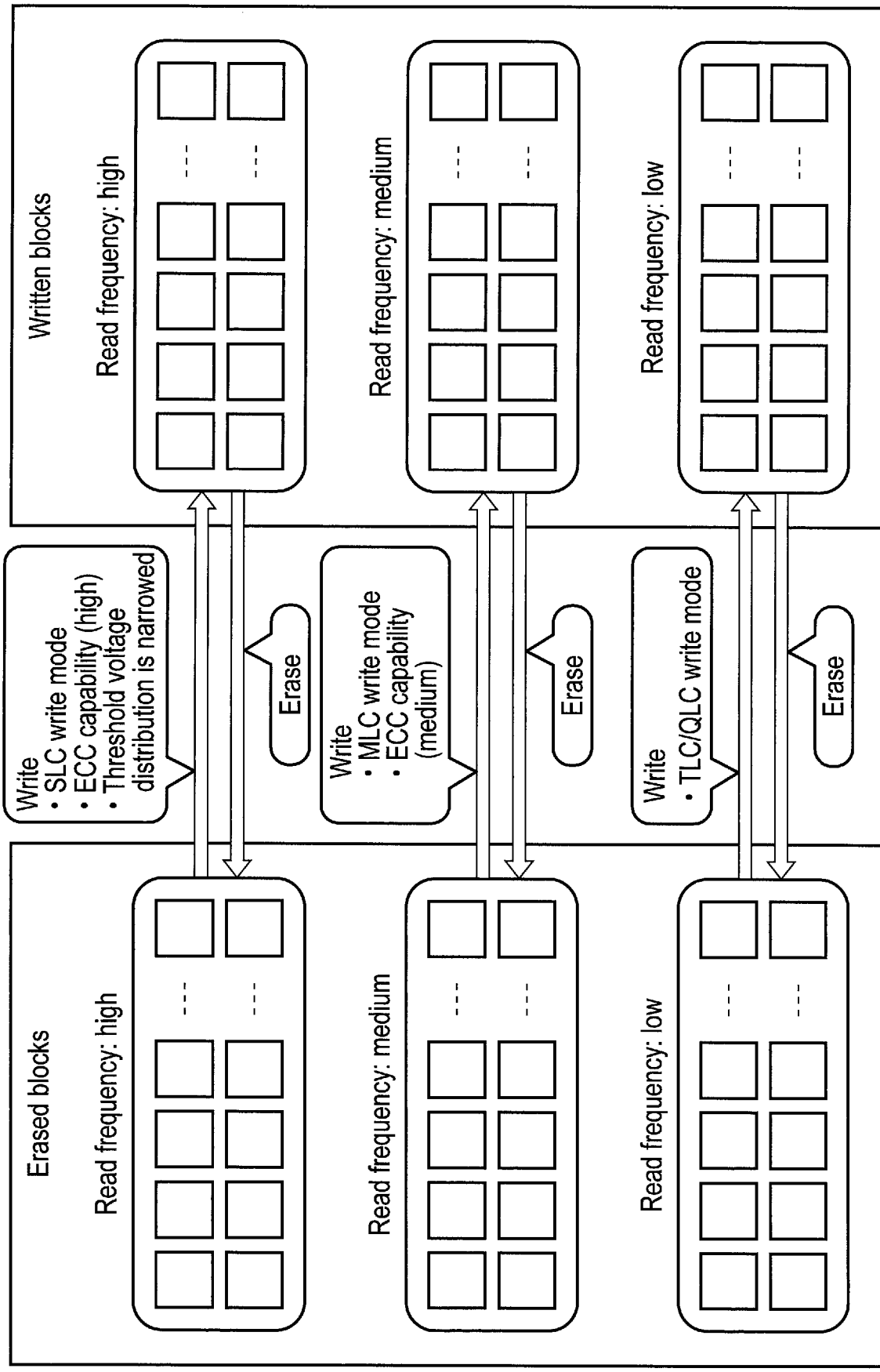
FIG. 28 is a diagram illustrating an example of selecting a writing method in the fifth countermeasure.
Figure 29:
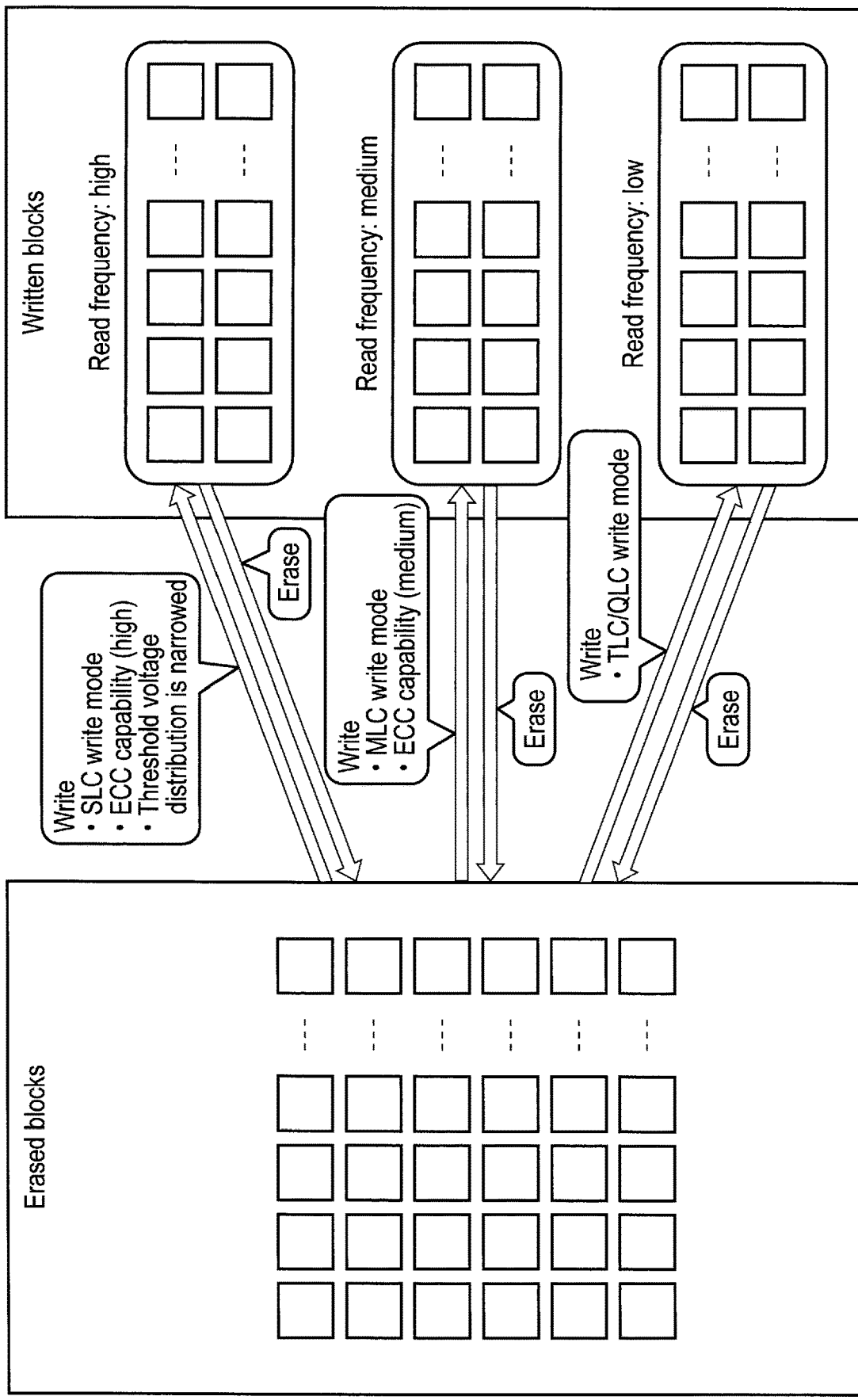
FIG. 29 is a diagram illustrating another example of selecting a writing method in the fifth countermeasure.

With reference to FIG. 28, FIGS. 27A and 27B, an example of the fifth countermeasure for moving data items determined to have substantially the same read frequency into one write destination block by the write method corresponding to the read frequency is illustrated. In FIG. 28, an erased block into which data items determined to have a high read frequency are to be written, an erased block into which data items determined to have a low read frequency are to be written, and an erased block into which data items determined to have a medium read frequency are to be written are separated and fixed. FIG. 29 illustrates an example in which one erased block can be used as a write destination block into which data items determined to have a high read frequency are to be written, a write destination block into which data items determined to have a low read frequency are to be written, or a write destination block into which data items determined to have a medium read frequency are to be written.

Write operations may include a host write operation in which data from the host 2 is written and a write operation by garbage collection. In the case of the host write operation, when a write command is issued, information about the read frequency together with the data may be supplied from the host 2 to the controller 4. In the case of the write operation by garbage collection, it is possible to obtain the information about the read frequency from the read count for each word line, page, cluster, or LBA range. In the above description, the information about read frequency is supplied from the host 2 together with the write command, but it may be notified from the host 2 in association with the LBA range. In this case, the LBA range notified from the host 2 need not be the size of the cluster unit (e.g., 4 KB).

The data items determined to have a high read frequency may be written by a write method having high reliability of data, the data items determined to have a medium read frequency may be written by a write method having slightly high reliability of data, and the data items determined to have a low read frequency may be written by other write methods. The method of writing data items determined to have a high read frequency may be (i) a write method in which the number of bits of data stored in one nonvolatile memory cell is small (for example, the SLC mode), (ii) a write method using the ECC having a high error correction capability, and (iii) a write method in which the waveform of the threshold voltage distribution becomes narrower as illustrated in FIG. 22A. The method of writing data items determined to have a medium read frequency may be (i) a write method in which the number of bits of data stored in one nonvolatile memory cell is medium (for example, the MLC mode) and (ii) a write method using the ECC having a medium error correction capability. The method of writing data items determined to have a low read frequency may be a write method in which the number of bits of data stored in one nonvolatile memory cell is large (for example, the TLC mode).

According to the fifth countermeasure, all the blocks are roughly classified into blocks of which the read count is large and blocks of which the read count is small by moving data items determined to have substantially the same read frequency to one write destination block. Thus, the execution frequency of the scan-read operation can be reduced in the blocks of which the read count is small. In addition, since the data in each block is read substantially uniformly, the execution frequency of the refresh operation can also be reduced.

By writing data stored in the memory cell of which the read frequency is high in data movement by using a write method having high data reliability, it is possible to appropriately set the determination criterion for starting the scan-read operation and the refresh operation, and it is possible to reduce the execution frequency of the scan-read operation and the refresh operation. Accordingly, it is possible to prevent the degradation in performance due to the scan-read operation, and the refresh operation and the reduction in lifetime of the flash memory 5 due to the refresh operation.

When the ECC having a high correction capability is used, it is possible to reduce the execution frequency of the refresh operation by setting the number of error bits, which is the condition for starting the refresh operation, to be large.

Since the processing of the present embodiment can be realized as a computer program, it is possible to easily realize the same effect as the present embodiment by merely installing the computer program on the computer through a computer readable storage medium having stored therein the computer program and executing the computer program.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory including blocks, each of the blocks including one or more sub-blocks, each of the one or more sub-blocks including nonvolatile memory cells; and
a controller electrically connected to the memory and configured to:
obtain read frequency of at least one of the sub blocks,
move data stored in the at least one of the sub-blocks so that data having substantially the same read frequency are written into one block,
obtain read frequency of at least one of the blocks including a first block,
in a case where the read frequency of the first block exceeds a first frequency, detect a data error rate of at least one of the sub-blocks in the first block,
in a case where the data error rate of the at least one of the sub-blocks in the first block exceeds a first rate, perform a movement of data stored in the at least one of the sub-blocks in the first block,
in a case where the data error rate of the at least one of the sub-blocks in the first block does not exceed the first rate, not perform the movement of data stored in the at least one of the sub-blocks in the first block,
in a case where the read frequency of a first sub-block among the at least one of the sub-blocks in the first block exceeds the first frequency, write data stored in the first sub-block into a second block by a first write method, and in a case where the read frequency of a second sub-block among the at least one of the sub-blocks in the first block does not exceed the first frequency, write data stored in the second sub-block into a third block by a second write method, the third block being different from the second block, wherein a number of bits of the data written into a nonvolatile memory cell in the second block is smaller than the number of bits of the data written into a nonvolatile memory cell in the third block.

2. The memory system according to claim 1, wherein the controller is further configured to write the data stored in the first sub-block into the second block with a first error correction coding, and write the data stored in the second sub-block into the third block with a second error correction coding having an error correction capability not higher than an error correction capability of the first error correction coding.

3. The memory system according to claim 1, wherein the controller is further configured to write the data stored in the first sub-block into the second block so that a threshold voltage distribution of nonvolatile memory cells in the second block has a first variation, write the data stored in the second sub-block into the third block so that a threshold voltage distribution of nonvolatile memory cells in the third block has a second variation, wherein the first variation is smaller than the second variation.

4. The memory system according to claim 1, wherein the controller is further configured to write the data stored in the first sub-block into the second block by a first write method so that a threshold voltage distribution of nonvolatile memory cells in the second block has a first center voltage, and write the data stored in the second sub-block into the third block by a second write method so that a threshold voltage distribution of nonvolatile memory cells in the third block has a second center voltage, wherein the first center voltage is higher than the second center voltage.

5. The memory system according to claim 1, wherein the controller is further configured to perform garbage collection and control the movement of data stored in the at least one of the sub-blocks by the garbage collection.

6. The memory system according to claim 1, wherein the at least one of the sub-blocks includes at least one of a group of the nonvolatile memory cells connected to a word line, a group of the nonvolatile memory cells connected to word lines, or a group of the nonvolatile memory cells storing data specified by a logical address range.

7. A memory system comprising:

a memory including blocks, each of the blocks including one or more sub-blocks, each of the one or more sub-blocks including nonvolatile memory cells; and a controller electrically connected to the memory and configured to:

obtain read frequency of at least one of the sub-blocks, move data stored in the at least one of the sub-blocks so that data having substantially the same read frequency are written into one block, obtain read frequency of at least one of the blocks including a first block, in a case where the read frequency of the first block exceeds a first frequency, detect a data error rate of at least one of the sub-blocks in the first block, in a case where the data error rate of the at least one of the sub-blocks in the first block exceeds a first rate, perform a movement of data stored in the at least one of the sub-blocks in the first block, in a case where the data error rate of the at least one of the sub-blocks in the first block does not exceed the first rate, not perform the movement of data stored in the at least one of the sub-blocks in the first block, in a case where the read frequency of a first sub-block among the at least one of the sub-blocks in the first block exceeds the first frequency, write data stored in the first sub-block into a second block with a first error correction coding, and in a case where the read frequency of a second sub-block among the at least one of the sub-blocks in the first block does not exceed the first frequency, write data stored in the second sub-block into a third block with a second error correction coding, the third block being different from the second block, the second error correction coding having an error correction capability not higher than an error correction capability of the first error correction coding.

8. The memory system according to claim 7, wherein the controller is further configured to:

write the data stored in the first sub-block into the second block by a first write method, and write the data stored in the second sub-block into the third block by a second write method, wherein a number of bits of the data written into a nonvolatile memory cell in the second block is smaller than the number of bits of the data written into a nonvolatile memory cell in the third block.

9. The memory system according to claim 7, wherein the controller is further configured to:

write the data stored in the first sub-block into the second block so that a threshold voltage distribution of nonvolatile memory cells in the second block has a first variation, and write the data stored in the second sub-block into the third block so that a threshold voltage distribution of nonvolatile memory cells in the third block has a second variation, wherein the first variation is smaller than the second variation.

10. The memory system according to claim 7, wherein the controller is further configured to:

write the data stored in the first sub-block into the second block by a first write method so that a threshold voltage distribution of nonvolatile memory cells in the second block has a first center voltage, and write the data stored in the second sub-block into the third block by a second write method so that a threshold voltage distribution of nonvolatile memory cells in the third block has a second center voltage, wherein the first center voltage is higher than the second center voltage.

11. The memory system according to claim 7, wherein the controller is further configured to perform garbage collection and control the movement of data stored in the at least one of the sub-blocks by the garbage collection.

12. The memory system according to claim 7, wherein the at least one of the sub-blocks includes at least one of a group of the nonvolatile memory cells connected to a word line, a group of the nonvolatile memory cells connected to word lines, or a group of the nonvolatile memory cells storing data specified by a logical address range.

13. A memory system comprising:

a memory including blocks, each of the blocks including one or more sub-blocks, each of the one or more sub-blocks including nonvolatile memory cells; and a controller electrically connected to the memory and configured to:

obtain read frequency of at least one of the sub-blocks, move data stored in the at least one of the sub-blocks so that data having substantially the same read frequency are written into one block, obtain read frequency of at least one of the blocks including a first block, in a case where the read frequency of the first block exceeds a first frequency, detect a data error rate of at least one of the sub-blocks in the first block, in a case where the data error rate of the at least one of the sub-blocks in the first block exceeds a first rate, perform a movement of data stored in the at least one of the sub-blocks in the first block, in a case where the data error rate of the at least one of the sub-blocks in the first block does not exceed the first rate, not perform the movement of data stored in the at least one of the sub-blocks in the first block, in a case where the read frequency of a first sub-block among the at least one of the sub-blocks in the first block exceeds the first frequency, write data stored in the first sub-block into a second block so that a threshold voltage distribution of nonvolatile memory cells in the second block has a first variation, and in a case where the read frequency of a second sub-block among the at least one of the sub-blocks in the first block does not exceed the first frequency, write data stored in the second sub-block into a third block so that a threshold voltage distribution of nonvolatile memory cells in the third block has a second variation, the third block being different from the second block, wherein the first variation is smaller than the second variation.

14. The memory system according to claim 13, wherein the controller is further configured to:

write the data stored in the first sub-block into the second block by a first write method, and write the data stored in the second sub-block into the third block by a second write method, wherein a number of bits of the data written into a nonvolatile memory cell in the second block is smaller than the number of bits of the data written into a nonvolatile memory cell in the third block.

15. The memory system according to claim 13, wherein the controller is further configured to:

write the data stored in the first sub-block into the second block with a first error correction coding, and write the data stored in the second sub-block into the third block with a second error correction coding having an error correction capability not higher than an error correction capability of the first error correction coding.

16. The memory system according to claim 13, wherein the controller is further configured to:

write the data stored in the first sub-block into the second block by a first write method so that a threshold voltage distribution of nonvolatile memory cells in the second block has a first center voltage, and write the data stored in the second sub-block into the third block by a second write method so that a threshold voltage distribution of nonvolatile memory cells in the third block has a second center voltage, wherein the first center voltage is higher than the second center voltage.

17. The memory system according to claim 13, wherein the controller is further configured to perform garbage collection and control the movement of data stored in the at least one of the sub-blocks by the garbage collection.

18. The memory system according to claim 13, wherein the at least one of the sub-blocks includes at least one of a group of the nonvolatile memory cells connected to a word line, a group of the nonvolatile memory cells connected to word lines, or a group of the nonvolatile memory cells storing data specified by a logical address range.

* * * * *